(12) United States Patent
Park et al.

(10) Patent No.: US 11,003,081 B2
(45) Date of Patent: May 11, 2021

(54) PHOTORESIST POLYMERS, METHODS OF FORMING PATTERNS AND METHODS OF MANUFACTURING SEMICONDUCTOR DEVICES

(71) Applicant: Samsung Electronics Co., Ltd., Suwon-si (KR)

(72) Inventors: Jin Park, Yongin-si (KR); Hyun-woo Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 198 days.

(21) Appl. No.: 16/156,264

(22) Filed: Oct. 10, 2018

(65) Prior Publication Data

US 2019/0040171 A1    Feb. 7, 2019

Related U.S. Application Data

(62) Division of application No. 14/804,775, filed on Jul. 21, 2015, now Pat. No. 10,113,022.

(30) Foreign Application Priority Data

Dec. 5, 2014    (KR) ................. 10-2014-0174331

(51) Int. Cl.
*G03F 7/36*    (2006.01)
*G03F 7/038*    (2006.01)
*C08F 214/14*    (2006.01)
*G03F 7/16*    (2006.01)
*G03F 7/20*    (2006.01)
*G03F 7/34*    (2006.01)
*C08G 75/26*    (2006.01)
*G03F 7/039*    (2006.01)
*C08F 214/18*    (2006.01)
*C08F 214/16*    (2006.01)

(52) U.S. Cl.
CPC ............. *G03F 7/36* (2013.01); *C08F 214/14* (2013.01); *C08F 214/16* (2013.01); *C08F 214/18* (2013.01); *C08G 75/26* (2013.01); *G03F 7/038* (2013.01); *G03F 7/0392* (2013.01); *G03F 7/0395* (2013.01); *G03F 7/0397* (2013.01); *G03F 7/16* (2013.01); *G03F 7/20* (2013.01); *G03F 7/34* (2013.01)

(58) Field of Classification Search
CPC .......... G03F 7/36; G03F 7/0382; G03F 7/038; C08F 218/14; C08F 214/16; C08F 214/18; C08F 214/14; H01L 29/66
USPC ..... 430/270.1, 907, 910; 526/242, 245, 287, 526/292.4, 308
See application file for complete search history.

(56) References Cited

U.S. PATENT DOCUMENTS

| | | |
|---|---|---|
| 6,479,212 B1 | 11/2002 | Matsuda et al. |
| 6,642,336 B1 | 11/2003 | Lee et al. |
| 7,261,995 B2 | 8/2007 | Watanabe et al. |
| 7,407,554 B2 | 8/2008 | Colburn et al. |
| 8,318,410 B2 | 11/2012 | Hiroi et al. |
| 8,501,382 B1 | 8/2013 | Brainard |
| 8,501,384 B2 | 8/2013 | Hatakeyama et al. |

(Continued)

*Primary Examiner* — John S Chu
(74) *Attorney, Agent, or Firm* — Harness, Dickey & Pierce, P.L.C.

(57) ABSTRACT

A photoresist polymer is synthesized from a repeating unit that comprises a first leaving group including an ester group, and a second leaving group capable of being removed together with the first leaving group.

19 Claims, 19 Drawing Sheets

(56) References Cited

U.S. PATENT DOCUMENTS

| | | |
|---|---|---|
| 8,686,098 B2 | 4/2014 | Mori et al. |
| 8,785,308 B2 | 7/2014 | Uenishi |
| 8,790,470 B2 | 7/2014 | Lee et al. |
| 8,796,080 B2 | 8/2014 | Kronholz et al. |
| 8,796,107 B2 | 8/2014 | Ahn et al. |
| 8,815,702 B2 * | 8/2014 | Oh .................. H01L 21/84 257/E21.442 |
| 8,821,752 B2 | 9/2014 | Cho et al. |
| 8,822,396 B2 | 9/2014 | Nakamura et al. |
| 8,828,871 B2 | 9/2014 | Zhou et al. |
| 2005/0048402 A1 | 3/2005 | Mizutani et al. |
| 2008/0248421 A1 * | 10/2008 | Fukuhara ............. G03F 7/0048 430/281.1 |
| 2010/0136485 A1 | 6/2010 | Hasegawa et al. |
| 2014/0094034 A1 | 4/2014 | Oyama et al. |
| 2014/0162193 A1 | 6/2014 | Iwashita et al. |
| 2014/0170563 A1 | 6/2014 | Hatakeyama |
| 2014/0227642 A1 | 8/2014 | Shirakawa et al. |
| 2014/0342275 A1 * | 11/2014 | Inasaki ................ C08F 212/14 430/5 |

\* cited by examiner

PHOTORESIST POLYMERS, METHODS OF FORMING PATTERNS AND METHODS OF MANUFACTURING SEMICONDUCTOR DEVICES

CROSS-REFERENCE TO RELATED APPLICATION

This application is a divisional of U.S. application Ser. No. 14/804,775, filed on Jul. 21, 2015, which claims priority under 35 USC § 119 to Korean Patent Application No. 10-2014-0174331, filed on Dec. 5, 2014 in the Korean Intellectual Property Office (KIPO), the contents of which are incorporated by reference herein in their entirety.

BACKGROUND

1. Field

Example embodiments relate to photoresist polymers, methods of forming patterns and methods of manufacturing semiconductor devices. More particularly, example embodiments relate to photo-chemically reactive photoresist polymers, methods of forming patterns and methods of manufacturing semiconductor devices using the photoresist polymers.

2. Description of the Related Art

A photolithography process may be utilized for a formation of various patterns included in a semiconductor device. For example, a photoresist layer may be divided into an exposed portion and a non-exposed portion by, e.g., an exposure process, and the exposed portion may be removed by a developing process to form a photoresist pattern. The object layer may be patterned using the photoresist pattern as an etching mask to form a desired pattern.

However, an intermediate component (e.g., an acid) may be generated from the exposure process, and a resolution of the photolithography process may be degraded by the intermediate component.

SUMMARY

Example embodiments provide a photoresist polymer having an improved resolution.

Example embodiments provide a method of forming a pattern using the photoresist polymer.

Example embodiments provide a method of manufacturing a semiconductor device using the photoresist polymer.

According to example embodiments, a photoresist polymer synthesized from a repeating unit includes a first leaving group including an ester group, and a second leaving group capable of being removed with the first leaving group.

In example embodiments, the first leaving group may be represented by one of Chemical Formula 1 and Chemical Formula 2.

  [Chemical Formula 1]

  [Chemical Formula 2]

In Chemical Formulae 1 and 2, $R_1$ may be one of hydrogen (H), a $C_1$-$C_{20}$ alkyl group, a $C_3$-$C_{10}$ cycloalkyl group, a $C_6$-$C_{30}$ aromatic group and a combination thereof.

In example embodiments, the second leaving group may include a halogen atom.

In example embodiments, the first leaving group and the second leaving group may be positioned in one of a staggered conformation and an anti-periplanar configuration.

In example embodiments, the repeating unit may be represented by one of Chemical Formula 3 and Chemical Formula 4.

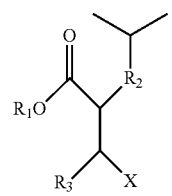  [Chemical Formula 3]

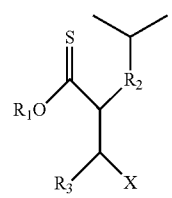  [Chemical Formula 4]

In Chemical Formulae 3 and 4, $R_1$ and $R_3$ may independently be one of hydrogen, a $C_1$-$C_{20}$ alkyl group, a $C_3$-$C_{10}$ cycloalkyl group, a $C_6$-$C_{30}$ aromatic group and a combination thereof. $R_2$ may be a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof. X may be one of fluorine (F), chlorine ($C_1$), bromine (Br) and iodine (I).

In example embodiments, $R_2$ and $R_3$ may be fused to form a ring structure.

In example embodiments, the repeating unit may be represented by Chemical Formula 5:

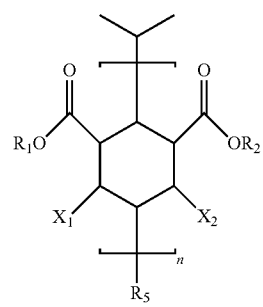  [Chemical Formula 5]

In Chemical Formula 5, $R_1$, $R_2$ and $R_5$ may be one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$ and $R_5$ are the same as or different from each other. $X_1$ and $X_2$ may be one of F, Cl, Br and I, and $X_1$ and $X_2$ may be the same as or different from each other. n may be an integer greater than 1.

In example embodiments, at least one of $R_1$ and $R_2$ may be connected to another repeating unit adjacent to the repeating unit.

In example embodiments, the repeating unit may be represented by Chemical Formula 6.

[Chemical Formula 6]

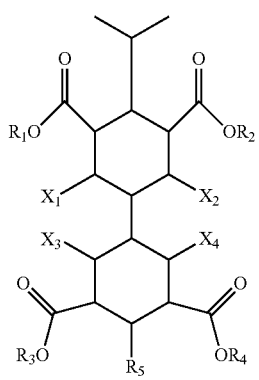

In Chemical Formula 6, $R_1$, $R_2$, $R_3$, $R_4$ and $R_5$ may be one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$, $R_3$, $R_4$ and $R_5$ may be the same as or different from each other. $X_1$, $X_2$, $X_3$, and $X_4$ may be one of F, Cl, Br and I, and $X_1$, $X_2$, $X_3$, and $X_4$ may be the same as or different from each other.

In example embodiments, the second leaving group may include a tosylate group.

According to example embodiments, a photoresist polymer includes a repeating unit represented by Chemical Formula 7.

[Chemical Formula 7]

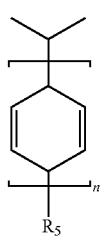

In Chemical Formula 7, $R_1$ may be one of hydrogen, a $C_1$-$C_{20}$ alkyl group, a $C_3$-$C_{10}$ cycloalkyl group, a $C_6$-$C_{30}$ aromatic group and a combination thereof. $R_2$ may be a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof.

According to example embodiments, a method of forming a pattern includes forming a photoresist layer on an object layer, the photoresist layer including a polymer synthesized from a repeating unit having a leaving group containing an ester group, performing an exposure process on the photoresist layer to form an exposed portion from which the leaving group containing the ester group is removed and a non-exposed portion at which the leaving group containing the ester group remains, etching the non-exposed portion of the photoresist layer to form a photoresist pattern.

In example embodiments, the repeating unit may further include a leaving group for elimination reaction.

In example embodiments, the repeating unit may be represented by the above one of Chemical Formula 3 and Chemical Formula 4, and the repeating unit may be converted to a structure as represented by Chemical Formula 8 in the exposed portion.

[Chemical Formula 8]

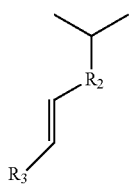

In example embodiments, the repeating unit may be represented by the above Chemical Formula 5, and the repeating unit may be converted to a structure as represented by Chemical Formula 9 in the exposed portion.

[Chemical Formula 9]

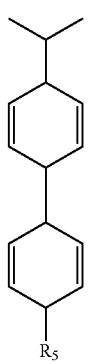

In example embodiments, the repeating unit may be represented by the above Chemical Formula 6, and the repeating unit may be converted to a structure as represented by Chemical Formula 10 in the exposed portion.

[Chemical Formula 10]

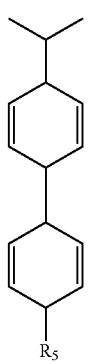

In example embodiments, the repeating unit may be represented by Chemical Formula 7, and the repeating unit may be converted to a structure as represented by Chemical Formula 11 in the exposed portion.

[Chemical Formula 11]

In example embodiments, the non-exposed portion of the photoresist layer may be selectively removed by a dry etching process.

In example embodiments, the exposed portion may have an etch-resistance greater than that of the non-exposed portion.

In example embodiments, the exposed portion may have a degree of unsaturation greater than that of the non-exposed portion.

In example embodiments, the number of one of oxygen and sulfur atoms included in the non-exposed portion may be greater than that included in the exposed portion.

In example embodiments, the exposed portion may have one of an anti-aromatic structure and a hyper-conjugation structure.

In example embodiments, the exposure process may be performed using at least one light source selected from extreme ultraviolet (EUV), Mine, KrF and ArF.

In example embodiments, the photoresist layer may be formed by coating a photoresist composition that may include the polymer, a solvent and a sensitizer.

In example embodiments, the object layer may be patterned using the photoresist pattern as an etching mask.

According to example embodiments, a method of forming a pattern includes forming a photoresist layer on an object layer, the photoresist layer including a polymer synthesized from a repeating unit that includes a first leaving group and a second leaving group, the first leaving group including an ester group, performing a selective exposure process on the photoresist layer to induce an elimination reaction such that the first leaving group and the second leaving group are separated from the polymer at an exposed portion of the photoresist layer, and removing a non-exposed portion of the photoresist layer to form a photoresist pattern.

In example embodiments, the first leaving group may be represented by the above one of Chemical Formula 1 and Chemical Formula 2, and the second leaving group may include halogen.

In example embodiments, the first and second leaving groups may be removed at the exposed portion so that a degree of unsaturation and an etch-resistance of the exposed portion may be increased.

According to example embodiments, a method of manufacturing a semiconductor device includes forming a plurality of active patterns defined by an isolation layer on a substrate, forming a photoresist layer on the active patterns and the isolation layer, the photoresist layer including a polymer synthesized from a repeating unit including a leaving group containing an ester group, performing an exposure process on the photoresist layer to form an exposed portion from which the leaving group containing the ester group is removed, and a non-exposed portion at which the leaving group containing the ester group remains, etching the non-exposed portion of the photoresist layer to form a photoresist pattern, partially etching the isolation layer and the active patterns using the photoresist pattern as an etching mask to form a plurality of trenches, and forming a gate structure in each of the plurality of trenches.

In example embodiments, forming the gate structure includes forming a gate insulation layer and a gate electrode layer filling the trenches sequentially on the plurality of active patterns and the isolation layer, and partially removing upper portions of the gate insulation layer and the gate electrode layer.

In example embodiments, the repeating unit may be represented by one of the above Chemical Formula 3 and Chemical Formula 4, and the repeating unit may be converted to a structure as represented by the above Chemical Formula 8 in the exposed portion.

According to example embodiments, a repeating unit of a photoresist polymer includes two leaving groups adjacent to each other and capable of being removed together from the photoresist polymer, the two leaving groups including a first ester leaving group and a second leaving group including one of a halogen and a tosylate group.

In example embodiments, the first ester leaving group may be represented by one of Chemical Formula 1 and Chemical Formula 2:

  [Chemical Formula 1]

  [Chemical Formula 2]

wherein, in Chemical Formulae 1 and 2, $R_1$ is one of hydrogen (H), a $C_1$-$C_{20}$ alkyl group, a $C_3$-$C_{10}$ cycloalkyl group, a $C_6$-$C_{30}$ aromatic group and a combination thereof.

In example embodiments, the first ester leaving group and the second leaving group may be positioned in one of a staggered conformation and an anti-periplanar configuration.

In example embodiments, the repeating unit may be represented by one of Chemical Formula 3 and Chemical Formula 4:

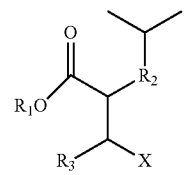  [Chemical Formula 3]

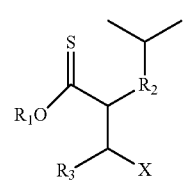  [Chemical Formula 4]

wherein, in Chemical Formulae 3 and 4, $R_1$ and $R_3$ may be independently one of hydrogen, a $C_1$-$C_{20}$ alkyl group, a $C_3$-$C_{10}$ cycloalkyl group, a $C_6$-$C_{30}$ aromatic group and a combination thereof, $R_2$ may be a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof, and X may be one of fluorine (F), chlorine ($C_1$), bromine (Br) and iodine (I).

In example embodiments, $R_2$ and $R_3$ may be fused to form a ring structure.

In example embodiments, the repeating unit may be represented by Chemical Formula 5:

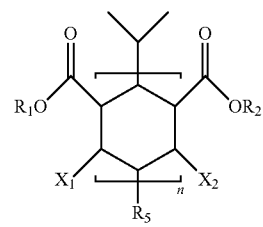  [Chemical Formula 5]

wherein, in Chemical Formula 5, each of $R_1$, $R_2$ and $R_5$ may be independently one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$ and $R_5$ may be the same as or different from each other, each of $X_1$ and $X_2$ may be independently one of F, Cl, Br and I, and $X_1$ and $X_2$ may be the same as or different from each other, and n may be an integer greater than 1.

In example embodiments, at least one of $R_1$ and $R_2$ may be connected to another repeating unit adjacent the repeating unit.

In example embodiments, the repeating unit may be represented by Chemical Formula 6:

[Chemical Formula 6]

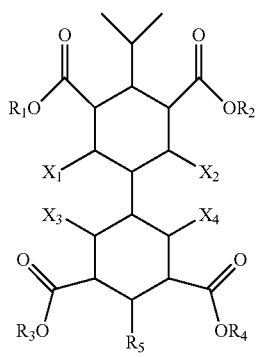

wherein, in Chemical Formula 6, each of $R_1$, $R_2$, $R_3$, $R_4$ and $R_5$ may be independently one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$, $R_3$, $R_4$ and $R_5$ may be the same as or different from each other, and $X_1$, $X_2$, $X_3$, and $X_4$ may be independently one of F, Cl, Br and I, and $X_1$, $X_2$, $X_3$, and $X_4$ may be the same as or different from each other.

In example embodiments, the halogen may be one of fluorine (F), chlorine (Cl), bromine (Br) and iodine (I).

BRIEF DESCRIPTION OF THE DRAWINGS

Example embodiments will be more clearly understood from the following detailed description taken in conjunction with the accompanying drawings.

FIGS. 1 to 6 are cross-sectional views illustrating a method of forming a pattern in accordance with example embodiments;

FIGS. 7 to 14 are cross-sectional views illustrating a method of forming a pattern in accordance with example embodiments; and FIGS. 15 to 30 are top plan views and cross-sectional views illustrating a method of manufacturing a semiconductor device in accordance with example embodiments.

DETAILED DESCRIPTION

Figure 1:
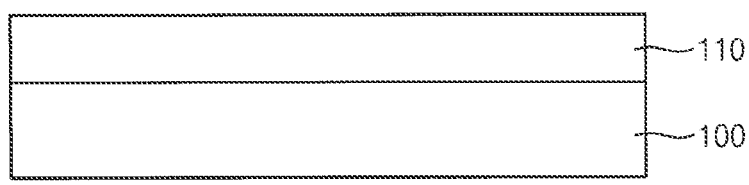
FIGS. 1 to 30 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Polymers

A photoresist polymer in accordance with example embodiments may include a repeating unit having a first leaving group, which may be repeatedly propagated in a backbone chain. The first leaving group may include an ester group.

The term "ester group" used herein may encompass a group containing a double bond of carbon and sulfur (C=S) instead of a carbonyl group (C=O) that may be included in a common ester group.

The backbone chain may include a carbon chain included in a photoresist material. For example, the backbone chain may include a polymer chain, e.g., novolak, polystyrene, polyhydroxystyrene (PHS), polyacrylate, polymethacrylate, polyvinyl ester, polyvinyl ether, polyolefin, polynorbornene, polyester, polyamide, or polycarbonate. In example embodiments, novolak, polystyrene, PHS or polyacrylate may be used as the backbone chain.

The first leaving group including the ester group may be represented by the following Chemical Formula 1 or Chemical Formula 2.

—$CO_2R_1$ [Chemical Formula 1]

—$CSOR_1$ [Chemical Formula 2]

In Chemical Formulae 1 and 2, $R_1$ may represent one of hydrogen (H), a $C_1$-$C_{20}$ alkyl group, a $C_3$-$C_{10}$ cycloalkyl group, a $C_6$-$C_{30}$ aromatic group and a combination thereof.

In example embodiments, the repeating unit may further include a second leaving group at a position adjacent to the first leaving group.

The second leaving group may include a group capable of being removed by an elimination reaction together with the first leaving group.

In example embodiments, the second leaving group may include a halogen atom, e.g., fluorine (F), chlorine ($C_1$), bromine (Br) or iodine (I). However, the second leaving group may include a desirable leaving group for an elimination reaction instead of the halogen atom. For example, the second leaving group may include a tosylate group (—OTs).

In example embodiments, the repeating unit may be represented by the following Chemical Formula 3 or Chemical Formula 4.

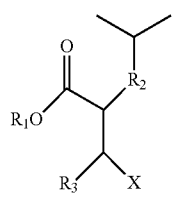

[Chemical Formula 3]

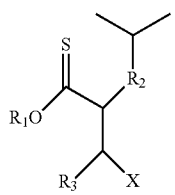

[Chemical Formula 4]

In Chemical Formulae 3 and 4, $R_1$ and $R_3$ may independently be one of hydrogen, a $C_1$-$C_{20}$ alkyl group, a $C_3$-$C_{10}$ cycloalkyl group, a $C_6$-$C_{30}$ aromatic group and a combination thereof. $R_2$ may be a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof. X may be one of F, Cl, Br and I.

In example embodiments, the first leaving group and the second leaving group may be oriented by a configuration facilitating the elimination reaction. For example, the first and second leaving groups may be oriented by one of a staggered conformation and a trans configuration. In example embodiments, the first and second leaving groups may form an anti-periplanar configuration.

Accordingly, the elimination reaction of the first and second leaving groups may be induced by a photo-chemical reaction through an exposure process using, e.g., an extreme ultraviolet (EUV) light source.

In example embodiments, $R_2$ and $R_3$ included in Chemical Formulae 3 and 4 may be connected to each other. In example embodiments, $R_2$ and $R_3$ may be fused to form a ring structure, e.g., a cycloalkyl group.

If the repeating unit includes a fused ring as described above, a plurality of the first leaving groups and a plurality of the second leaving groups may be included in one repeating unit. Thus, a plurality of the elimination reactions may occur from the one repeating unit.

In example embodiments as described above, the repeating unit may be represented by the following Chemical Formula 5.

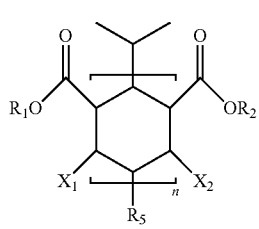

[Chemical Formula 5]

In Chemical Formula 5, $R_1$, $R_2$ and $R_5$ may independently be one of hydrogen, a $C_1$-$C_{20}$ alkyl group, a $C_3$-$C_{10}$ cycloalkyl group, a $C_6$-$C_{30}$ aromatic group and a combination thereof. $R_1$, $R_2$ and $R_5$ may be the same as or different from each other. $X_1$ and $X_2$ may independently be one of F, Cl, Br and I. $X_1$ and $X_2$ may be the same as or different from each other. n is an integer greater than 1. For example, n is an integer from 1 to 5.

For example, if n is 2, the repeating unit may be represented by the following Chemical Formula 6.

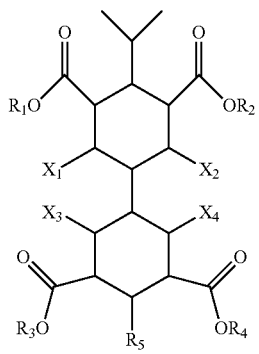

[Chemical Formula 6]

In Chemical Formula 6, $R_1$, $R_2$, $R_3$, $R_4$ and $R_5$ may independently be one of hydrogen, a $C_1$-$C_{20}$ alkyl group, a $C_3$-$C_{10}$ cycloalkyl group, a $C_6$-$C_{30}$ aromatic group and a combination thereof. $R_1$, $R_2$, $R_3$, $R_4$ and $R_5$ may be the same as or different from each other. $X_1$, $X_2$, $X_3$, and $X_4$ may independently be one of F, Cl, Br and I. $X_1$, $X_2$, $X_3$, and $X_4$ may be the same as or different from each other.

In some example embodiments, at least one of $R_1$ to $R_4$ in the above Chemical Formula 5 or Chemical Formula 6 may be connected to another neighboring repeating unit included in the photoresist polymer. In example embodiments, the first leaving groups included in different repeating units may be connected as a net structure.

For example, the structure of the repeating units may be represented by the following Chemical Formula 6-1.

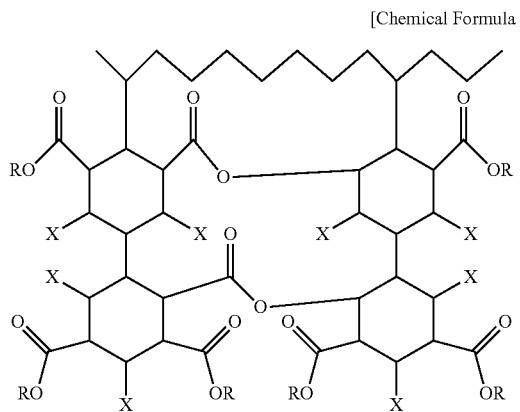

[Chemical Formula 6-1]

In Chemical Formula 6-1, R may represent one of hydrogen, a $C_1$-$C_{20}$ alkyl group, a $C_3$-$C_{10}$ cycloalkyl group, a $C_6$-$C_{30}$ aromatic group and a combination thereof. X may represent a halogen atom, for example, one of F, Cl, Br and I.

In example embodiments, the photoresist polymer may include a COS leaving group. For example, the photoresist polymer may include a repeating unit represented by the following Chemical Formula 7.

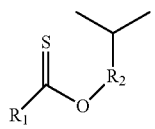

[Chemical Formula 7]

In Chemical Formula 7, $R_1$ and $R_2$ may be substantially the same as those defined in the above Chemical Formulae 3 and 4.

As described above, the photoresist polymer according to example embodiments may include a leaving group reactive in an elimination reaction, a decarboxylation and/or a deesterification. For example, the elimination reaction, the decarboxylation and/or the deesterification may be caused by a photo-chemical reaction induced by an exposure process so that chemical structures in an exposed portion and a non-exposed portion of the photoresist polymer may be differentiated.

In example embodiments, the number of double bonds, or a degree of unsaturation of the exposed portion may be greater than that of the non-exposed portion. In example embodiments, the number of oxygen atoms or sulfur atoms in the non-exposed portion may be greater than that of the exposed portion.

Thus, etching rates of the exposed portion and the non-exposed portion may be different from each other because of the differences in chemical structures as described above. Various patterns may be formed using the photoresist polymer based on the difference of the etching rates.

Methods of Forming Patterns

FIGS. 1 to 6 are cross-sectional views illustrating a method of forming a pattern in accordance with example embodiments. For example, FIGS. 1 to 6 illustrate the method of forming patterns utilizing the above-mentioned photoresist polymer.

Referring to FIG. 1, an object layer 110 may be formed on a substrate 100. The substrate 100 may include a silicon substrate, a germanium substrate, a silicon-germanium substrate, a silicon-on-insulator (SOI) substrate or a germanium-on-insulator (GOI) substrate. In example embodiments, the substrate 100 may include a group III-V compound, e.g., GaP, GaAs or GaSb.

An image may be transferred from a photoresist pattern to the object layer 110 so that the object layer 110 may be converted to a predetermined or given pattern. In example embodiments, the object layer 110 may be formed of an insulative material, e.g., silicon oxide, silicon nitride or silicon oxynitride. In example embodiments, the object layer 110 may be formed of a conductive material, e.g., a metal, a metal nitride, a metal silicide or a metal silicide nitride. In example embodiments, the object layer 110 may be formed of a semiconductor material, e.g., polysilicon.

The object layer 110 may be formed by at least one process of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD) process, and a physical vapor deposition (PVD) process.

Figure 2:
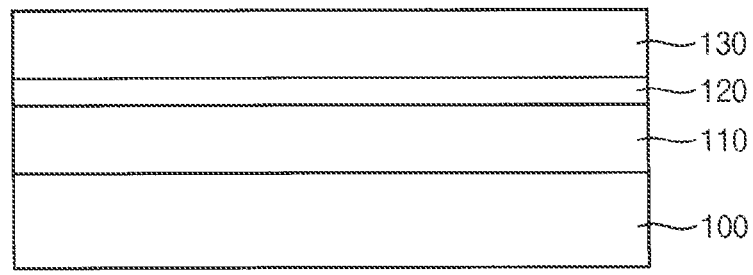

Referring to FIG. 2, an anti-reflective layer 120 and a photoresist layer 130 may be sequentially formed on the object layer 110.

The anti-reflective layer 120 may be formed using an aromatic organic composition, for example, a phenol resin or a novolak resin, or an inorganic material, for example, silicon oxynitride. The anti-reflective layer 120 may be formed by a coating process, for example, a spin coating process, a dip coating process or a spray coating process, or a deposition process, for example, a CVD process. The anti-reflective layer 120 may also serve as a planarization layer. In example embodiments, the formation of the anti-reflective layer 120 may be omitted.

The photoresist layer 130 may be formed of the above-described photoresist polymer. In example embodiments, a photoresist composition including the photoresist polymer and a solvent may be prepared, and then the photoresist composition may be coated on the object layer 110 or the anti-reflective layer 120 to form the photoresist layer 130.

For example, the photoresist layer 130 may be formed by, e.g., a spin coating process, a dip coating process or a spray coating process. In example embodiments, the photoresist composition may be coated to form a preliminary photoresist layer, and the preliminary photoresist layer may be cured by, e.g., a baking process to form the photoresist layer 130.

As described above, the photoresist polymer may include a polymer synthesized from repeating units, each of which may include a leaving group containing an ester group.

In example embodiments, the repeating unit of the photoresist polymer may further include a leaving group for elimination reaction. The leaving group containing the ester group, and the leaving group for elimination reaction may be designated as a first leaving group and a second leaving group, respectively.

In example embodiments, the first leaving group may be represented by the above Chemical Formula 1 or Chemical Formula 2. The second leaving group may include a group more easily removed by an elimination reaction. For example, the second leaving group may include a halogen atom. The first and second leaving groups may be positioned by a staggered conformation, a trans configuration or an anti-periplanar configuration for facilitating the elimination reaction.

In example embodiments, the repeating unit may be represented by the above Chemical Formula 3 or Chemical Formula 4.

In example embodiments, the repeating unit may include a ring structure, e.g., cycloalkyl. In example embodiments, the first and second leaving groups may be included in the ring structure as substituents.

For example, the repeating unit may be represented by the above Chemical Formula 5, Chemical Formula 6 or Chemical Formula 6-1.

In example embodiments, the repeating unit of the photoresist polymer may include a leaving group containing an ester group that may have sulfur. In example embodiments, the leaving group may include a —COS group, and the repeating unit may be represented by the above Chemical Formula 7.

The solvent may include an organic solvent having an improved solubility for a polymer material, and an improved coatability for a formation of a uniform photoresist layer. Examples of the solvent may include cyclohexanone, cyclopentanone, tetrahydrofuran (THF), dimethylformamide, propylene glycol monomethyl ether acetate (PGMEA), ethyl lactate, methyl ethyl ketone, benzene or toluene. These may be used alone or in a combination thereof.

In example embodiments, the photoresist composition may further include a sensitizer for facilitating a photo-chemical reaction in a subsequent exposure process. An amount of photons may be amplified by the sensitizer so that the elimination reaction may be sufficiently induced in an exposed portion.

The sensitizer may include, e.g., benzophenone, benzoyl, thiophene, naphthalene, anthracene, phenanthrene, pyrene, coumarin, thioxantone, acetophenone, naphtoquinone, or anthraquinone. These may be used alone or in a combination thereof.

The photoresist composition may further include an additive for improving chemical and physical properties thereof. The additive may include, e.g., a leveling agent, a viscosity modifier, or a surfactant.

In example embodiments, a photoacid generator (PAG) may be excluded from the photoresist composition. Accordingly, the exposed portion may be formed only by the photo-chemically induced elimination reaction without an intermediation of an acid (proton: H+) in the exposure process.

Figure 3:
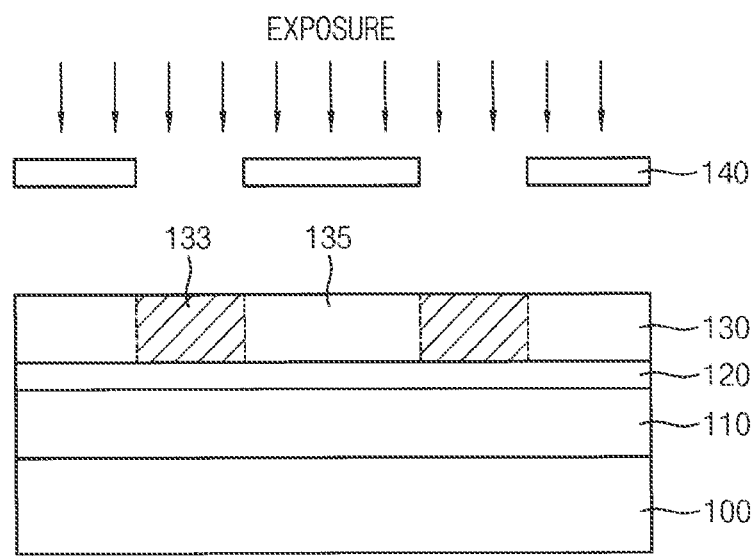

Referring to FIG. 3, the exposure process may be performed on the photoresist layer 130.

In example embodiments, an exposure mask 140 may be placed on the photoresist layer 130, and a light may be irradiated through an opening or a transmission portion included in the exposure mask 140. Non-limiting examples of a light source used in the exposure process may include ArF, KrF, an electron beam, I-line or EUV.

The photoresist layer 130 may be divided into an exposed portion 133 and a non-exposed portion 135. For example, a chemical structure in the exposed portion 133 may be modified through a mechanism shown by the following Reaction Scheme 1.

[Reaction Scheme 1]

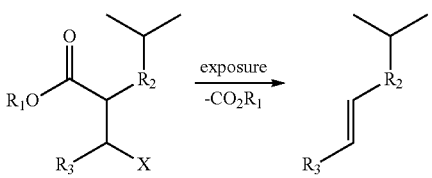

Referring to Reaction Scheme 1, when the photons may be generated in the exposure process, an ester group having a sensitivity for the photons may participate in a photo-chemical reaction together with the photons. Accordingly, decarboxylation may occur so that the first repeating unit represented by —$CO_2R_1$ may be separated from the repeating unit. As the first leaving group is removed, the elimination reaction may be induced in the repeating unit. In example embodiments, the second leaving group that may be positioned by, e.g., the trans configuration or the anti-periplanar configuration relatively to the first leaving group may be also detached from the repeating unit. Both of the first and second leaving groups may be separated from the repeating unit by the elimination reaction so that a double bond may be created in the repeating unit.

In example embodiments, the elimination reaction may be progressed according to E1 mechanism or E2 mechanism.

If the repeating unit of the photoresist polymer is represented by the above Chemical Formula 3 or Chemical Formula 4, the exposed portion 133 may include a repeating unit represented by the following Chemical Formula 8.

[Chemical Formula 8]

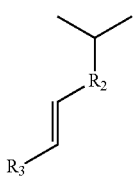

If the repeating unit of the photoresist polymer is represented by the above Chemical Formula 5, the exposed portion 133 may include a repeating unit represented by the following Chemical Formula 9.

[Chemical Formula 9]

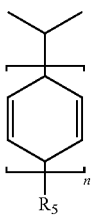

If the repeating unit of the photoresist polymer is represented by the above Chemical Formula 6, the exposed portion 133 may include a repeating unit represented by the following Chemical Formula 10.

[Chemical Formula 10]

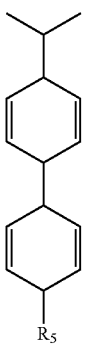

If the repeating unit of the photoresist polymer is represented by the above Chemical Formula 6-1, the exposed portion 133 may include a repeating unit represented by the following Chemical Formula 10-1.

[Chemical Formula 10-1]

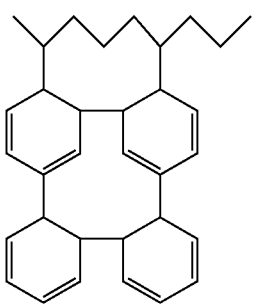

In example embodiments, if the repeating unit of the photoresist polymer includes the —COS leaving group as represented by the above Chemical Formula 7, the exposed portion 133 may include a repeating unit represented by the following Chemical Formula 11.

[Chemical Formula 11]

According to the mechanism as shown in Reaction Scheme 1, the exposed portion 133 may have a degree of unsaturation greater than that of the non-exposed portion 135. Further, the non-exposed portion 135 may include more oxygen atoms or sulfur atoms than the exposed portion 133, because the ester group may be removed in the exposed portion 133 by the exposure process or the photo-chemical reaction.

In example embodiments, the exposed portion 133 may have an etch-resistance with respect to, e.g., a dry etching process greater than that of the non-exposed portion 135.

The etch-resistance may be evaluated by, e.g., an Ohnish parameter calculated by the following Experimental Equation.

(Total number of atoms)/{(Number of carbon atoms)−(Number of oxygen atoms)}   [Experimental Equation]

As a value of the Ohnish parameter calculated by the Experimental Equation becomes larger, the etch-resistance with respect to the dry etching process may be reduced. Conversely, when the value of the Ohnish parameter is decreased, the etch-resistance may be increased.

As described above, the degree of unsaturation may be increased in the exposed portion 133, and thus the total number of atoms may be decreased therein. Additionally, the oxygen and sulfur atoms may be removed in the exposed portion 133, and thus the number of oxygen atoms may be also decreased. Therefore, the Ohnish parameter of the exposed portion 133 may be smaller than that of the non-exposed portion 135, and thus the etch-resistance of the exposed portion 133 may be evaluated as greater than that of the non-exposed portion 135.

In example embodiments, as illustrated with reference to Chemical Formula 9, 10 or 10-1, one repeating unit included in the exposed portion 133 may include a plurality of double bonds. Further, the one repeating unit included in the exposed portion 133 may include at least one ring structure, and a plurality of the double bonds may be included in one ring structure.

Accordingly, the one repeating unit in the exposed portion 133 may have an anti-aromaticity structure or a hyper-conjugation structure. In the anti-aromaticity or hyper-conjugation structure, a chemical structure may be stabilized by an interaction between the neighboring double bonds, or an interaction between neighboring pi-bond or sigma bond. Thus, bonding force or stability of the repeating unit may be improved so that the etch-resistance of the exposed portion 133 may be further increased.

Figure 4:
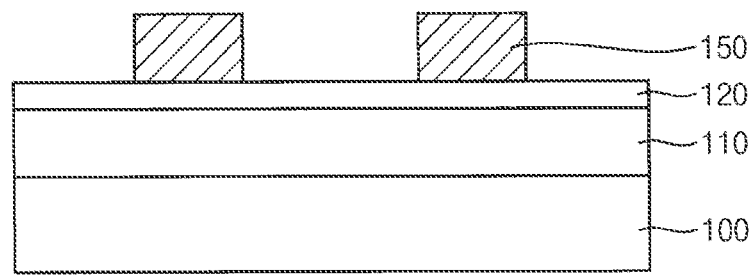

Referring to FIG. 4, the non-exposed portion 135 of the photoresist layer 130 may be selectively removed by a dry etching process. A photoresist pattern 150 may be defined by the exposed portion 133 remaining on the object layer 110 or the anti-reflective layer 120.

The dry etching process may include a plasma etching process or a reactive ion etching (RIE) process.

As described above, the exposed portion 133 may have the etch-resistance greater than that of the non-exposed portion 135 so that the non-exposed portion 135 may be selectively removed through the dry etching process without damaging the exposed portion 133.

Further, the non-exposed portion 135 may have relatively strong hydrophilicity and/or polarity due to remaining ester groups. Thus, the non-exposed portion 135 may have a relatively high affinity for the plasma etching process or the RIE process. Accordingly, an etching selectivity for the non-exposed portion 135 with respect to the exposed portion 133 may be further enhanced.

In a comparative example, while performing an exposure process in which a chemically amplified resist (CAR) system using a PAG is implemented, an acid may be diffused into the non-exposed portion 135 to increase a surface roughness of the photoresist pattern 150. The non-exposed portion 135 may be also damaged by the acid, and thus the photoresist pattern 150 having desired width and/or pitch may not be obtained. As a critical dimension of the photoresist pattern 150 or a target pattern formed by a photolithography process is decreased, a pattern damage by the acid diffusion may be exacerbated.

In the comparative example, e.g., the exposed portion 133 is removed by a developing process. However, the non-exposed portion 135 may be also damaged by a developing solution, for example, tetra methyl ammonium hydroxide (TMAH), to result in deterioration of a pattern resolution. A process cost and a process time may be also increased by the developing process.

However, according to example embodiments as described above, the acid from the PAG may be excluded from the exposure process, and the exposed portion 133 may be obtained only through the elimination reaction, decarboxylation and/or deesterification that may be photo-chemically induced. Therefore, a photolithography process system which may be substantially free of the pattern damage caused by an irregular acid diffusion may be realized. Further, the photoresist pattern 150 and the target pattern having desired fine width and/or pitch may be precisely formed.

Additionally, the exposed portion 133 and the non-exposed portion 135 may have remarkably different etch-resistances from each other as described above. Thus, the non-exposed portion 135 may be selectively removed by, e.g., a conventional dry etching process without performing the developing process to form the photoresist pattern 150. Accordingly, the pattern damage by the developing process may be avoided, and entire process cost and time may be shortened.

Figure 5:
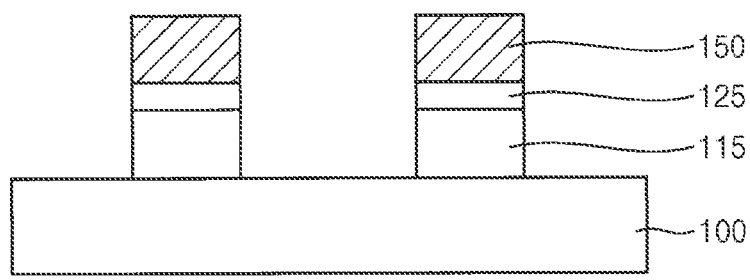

Referring to FIG. 5, the anti-reflective layer 120 and the object layer 110 may be etched using the photoresist pattern 150 as an etching mask. Accordingly, an anti-reflective layer pattern 125 and an object layer pattern 115 may be formed between the photoresist pattern 150 and the substrate 100.

The etching process may include a dry etching process or a wet etching process properly selected in consideration of an etching selectivity between the photoresist pattern 150 and the object layer 110.

In example embodiments, the dry etching process may include a plasma etching process.

In example embodiments, a proper etchant solution, for example, fluoric acid, phosphoric acid, sulfuric acid or peroxide, may be selected depending on a material included in the object layer 110.

Figure 6:
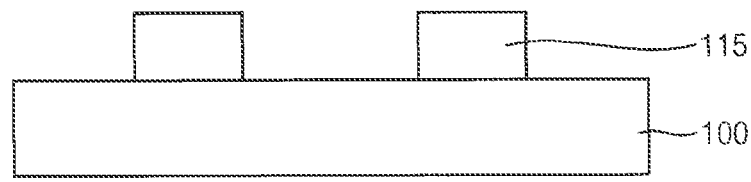

Referring to FIG. 6, the photoresist pattern 150 and the anti-reflective layer pattern 125 may be removed such that the object layer pattern 115 may remain on the substrate 100.

In example embodiments, the photoresist pattern 150 and the anti-reflective layer pattern 125 may be removed by an ashing process and/or a strip process. In example embodiments, the photoresist pattern 150 and the anti-reflective layer pattern 125 may be removed by a planarization process, e.g., a chemical mechanical polish (CMP) process.

If the object layer 110 includes a conductive material, the object layer pattern 115 may serve as a wiring, a contact, a pad, a plug, or an interconnection structure of a semiconductor device.

If the object layer 110 includes an insulative material, the object layer pattern 115 may serve as a predetermined or given insulation pattern, e.g., an insulating interlayer pattern or a filling insulation pattern. In example embodiments, a portion of the object layer 110 removed by the etching process may be converted into a contact hole, an opening or a trench included in the insulation pattern.

FIGS. 7 to 14 are cross-sectional views illustrating a method of forming a pattern in accordance with some example embodiments. For example, FIGS. 7 to 14 illustrate a method of forming a conductive pattern utilizing the above-mentioned photoresist polymer.

Detailed descriptions on processes and/or materials substantially the same as or similar to those illustrated with reference to FIGS. 1 to 6 are omitted herein.

Figure 7:
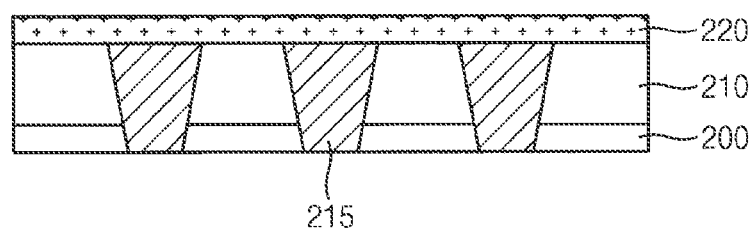

Referring to FIG. 7, a lower contact 215 extending through a lower insulation layer 210 may be formed. A plurality of the lower contacts 215 may be formed in the lower insulation layer 210.

In example embodiments, the lower insulation layer 210 may be formed on a passivation layer 200, and a contact hole extending through the lower insulation layer 210 and the passivation layer 200 may be formed. The lower contact 215 may be formed by filling a conductive layer in the contact hole by a deposition process or a plating process.

In example embodiments, the method of forming patterns in accordance with example embodiments as illustrated in FIGS. 1 to 6 may be implemented for the formation of the contact hole using the lower insulation layer 210 as an object layer.

The lower insulation layer 210 may be formed of an insulative material, e.g., silicon oxide or silicon oxynitride. For example, the lower insulation layer 210 may be formed of a silicon oxide-based material, e.g., plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), or boro phospho silicate glass (BPSG).

The passivation layer 200 may be formed of silicon nitride. The conductive layer may be formed of a metal (e.g., aluminum (Al), tungsten (W) or copper (Cu), or a metal nitride) in example embodiments.

In example embodiments, the lower contact 215 may be electrically connected to a circuit device or a lower wiring formed on a semiconductor substrate. Damages of the circuit device or the lower wiring while forming the contact hole may be prevented or inhibited by the passivation layer 200.

A first etch-stop layer 220 may be formed on the lower insulation layer 210 to cover the lower contacts 215. The first etch-stop layer 220 may be formed of silicon nitride or silicon oxynitride. For example, the first etch-stop layer 220 may be formed by, e.g., a CVD process, a PECVD process, a spin coating process or an ALD process.

Figure 8:
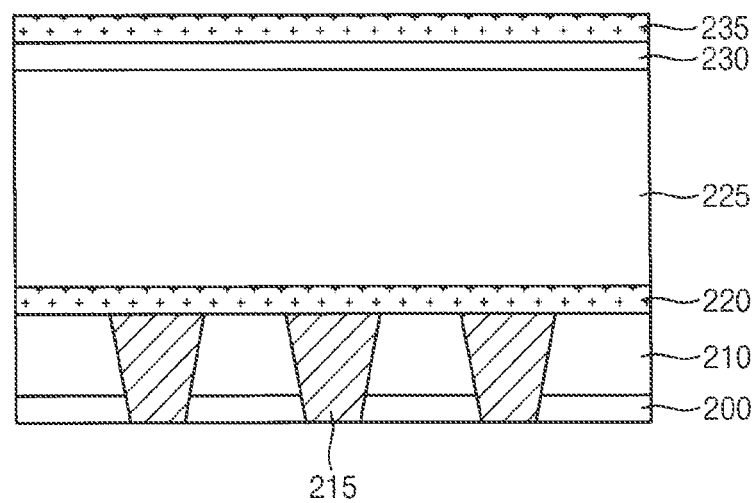

Referring to FIG. 8, an insulating interlayer 225, a buffer layer 230 and a second etch-stop layer 235 may be sequentially formed on the first etch-stop layer 220.

For example, the insulating interlayer 225 may be formed of the above-mentioned silicon oxide-based material, or a polysiloxane-based material. The buffer layer 230 and the second etch-stop layer 235 may be formed of, e.g., silicon oxynitride and silicon nitride, respectively. A stress generated from the second etch-stop layer 235 may be alleviated or absorbed by the buffer layer 230.

The insulating interlayer 225, the buffer layer 230 and the second etch-stop layer 235 may be formed by a CVD process, a PECVD process, a sputtering process (e.g., an ion beam sputtering process), or a spin coating process.

Figure 9:
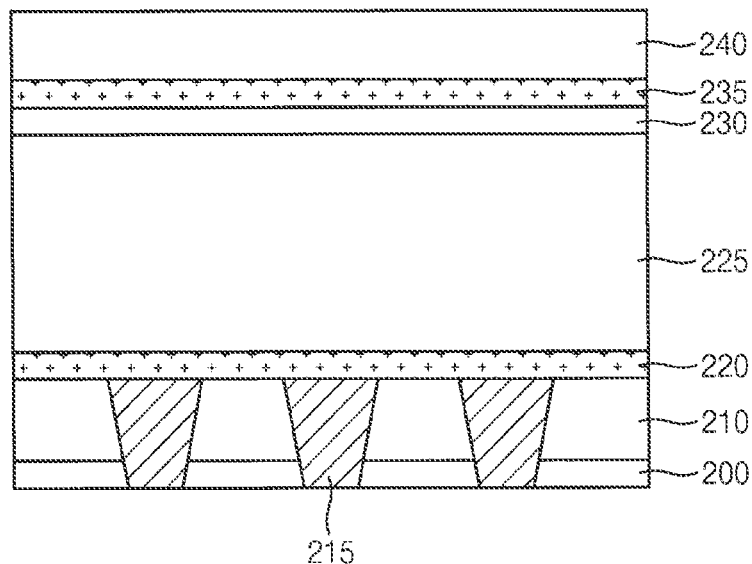

Referring to FIG. 9, a photoresist layer 240 may be formed on the second etch-stop layer 235.

In example embodiments, the photoresist layer 240 may be formed by a process substantially the same as or similar to that illustrated with reference to FIG. 2.

Accordingly, the photoresist layer 240 may include the above-described photoresist polymer. The photoresist polymer may include a polymer synthesized from repeating units to which a leaving group containing an ester group (e.g., a first leaving group) is combined. The repeating unit of the photoresist polymer may further include a leaving group for elimination reaction (e.g., a second leaving group) that may be removed together with the leaving group containing the ester group.

The first leaving group may be represented by the above Chemical Formula 1 or Chemical Formula 2. The second leaving group may include, e.g., a halogen atom.

In some example embodiments, the repeating unit may have a structure substantially the same as or similar to that represented by the above Chemical Formulae 3, 4, 5, 6 or 6-1. In example embodiments, the repeating unit of the photoresist polymer may include a leaving group containing an ester group that may have sulfur as represented by the above Chemical Formula 7.

For example, a photoresist composition including the photoresist polymer may be coated on the second etch-stop layer 235, and then a thermal curing process, e.g., a baking process may be performed to form the photoresist layer 240. The photoresist composition may further include a sensitizer.

Figure 10:
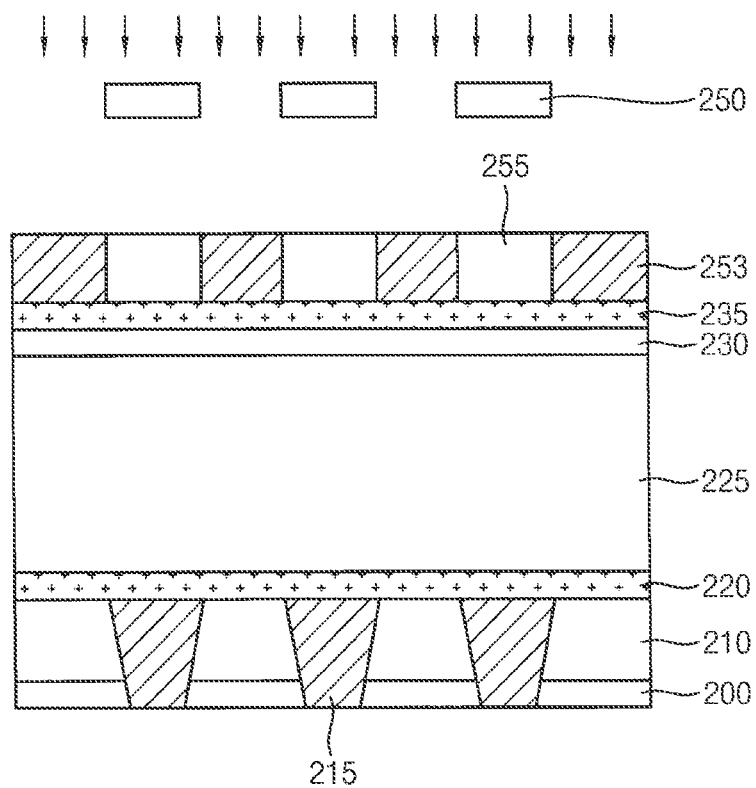

Referring to FIG. 10, a process substantially the same as or similar to that illustrated with reference to FIG. 3 may be performed.

For example, an exposure mask 250 may be placed on the photoresist layer 240, and then an exposure process may be performed on the photoresist layer 240 using an EUV light source. Thus, the photoresist layer 240 may be divided into an exposed portion 253 and a non-exposed portion 255.

The elimination reaction, decarboxylation and/or deesterification may be initiated in the exposed portion 253 by the exposure process so that an etch-resistance of the exposed portion 253 may be remarkably increased relatively to the non-exposed portion 255.

Figure 11:
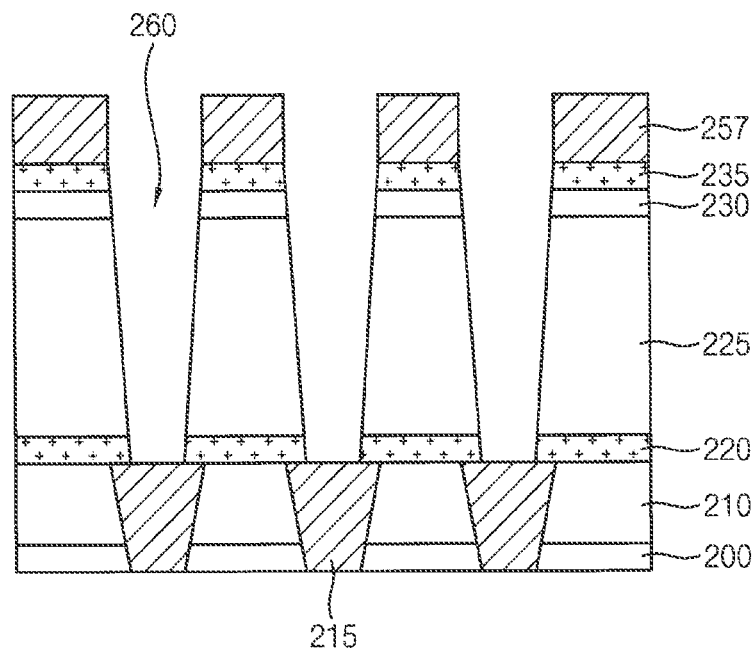

Referring to FIG. 11, a process substantially the same as or similar to that illustrated with reference to FIG. 4 may be performed so that the non-exposed portion 255 of the photoresist layer 240 may be removed. Accordingly, the exposed portion 253 may remain on the second etch-stop layer 235 so that a photoresist pattern 257 may be defined.

As described above, the non-exposed portion 255 having a relatively low etch-resistance may be selectively removed by a dry etching process.

Subsequently, the second etch-stop layer 235, the buffer layer 230, the insulating interlayer 225 and the first etch-stop layer 220 may be partially and sequentially etched using the photoresist pattern 257 as an etching mask. Thus, an opening 260 exposing the lower contact 215 may be formed.

The opening 260 may be formed by a dry etching process. The opening 260 may extend through the insulating interlayer 225 and the first etch-stop layer 220, and may at least partially expose an upper surface of the lower contact 215.

In example embodiments, the etching process for the removal of the non-exposed portion 255, and the etching process with respect to the second etch-stop layer 235, the buffer layer 230, the insulating interlayer 225 and/or the first etch-stop layer 220 may be performed in the same process chamber in-situ.

In example embodiments, the opening 260 may have a contact hole shape through which each lower contact 215 may be exposed. In example embodiments, the opening 260 may have a linear shape through which a plurality of the lower contacts 215 may be exposed.

Figure 12:
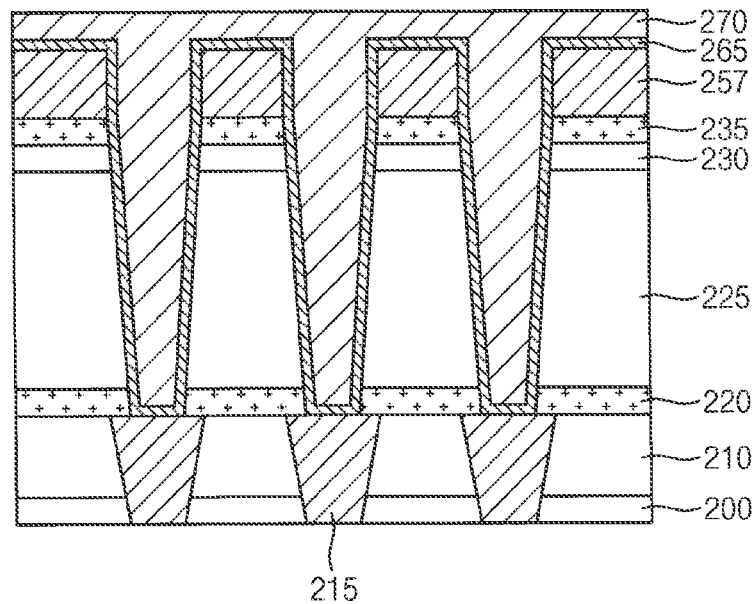

Referring to FIG. 12, a conductive layer 270 filling the openings 260 may be formed.

In example embodiments, a barrier layer 265 may be formed conformally along top surfaces and sidewalls of the photoresist pattern 257, and sidewalls and bottoms of the openings 260. The conductive layer 270 may be formed on the barrier layer 265 to sufficiently fill the openings 260.

The barrier layer 265 may be formed of a metal nitride, e.g., titanium nitride, tantalum nitride or tungsten nitride. The barrier layer 265 may prevent or inhibit a metal ingredient in the conductive layer 270 from being diffused into the insulating interlayer 225. The barrier layer 265 may also provide an adhesion for the formation of the conductive layer 270. The barrier layer 265 may be formed by, e.g., a sputtering process or an ALD process.

The conductive layer 270 may be formed by, e.g., an electroplating process. In example embodiments, a seed layer may be formed conformally on the barrier layer 265 by a sputtering process using a copper target. A plating solution, e.g., a copper sulfate solution, may be prepared, and a current may be applied using the seed layer and the plating solution as a cathode and an anode, respectively. Thus, the conductive layer 270 including copper may be grown or precipitated on the seed layer through an electrochemical reaction.

In example embodiments, the conductive layer 270 may be deposited by a sputtering process using a metal target, e.g., copper, tungsten or aluminum, or an ALD process.

Figure 13:
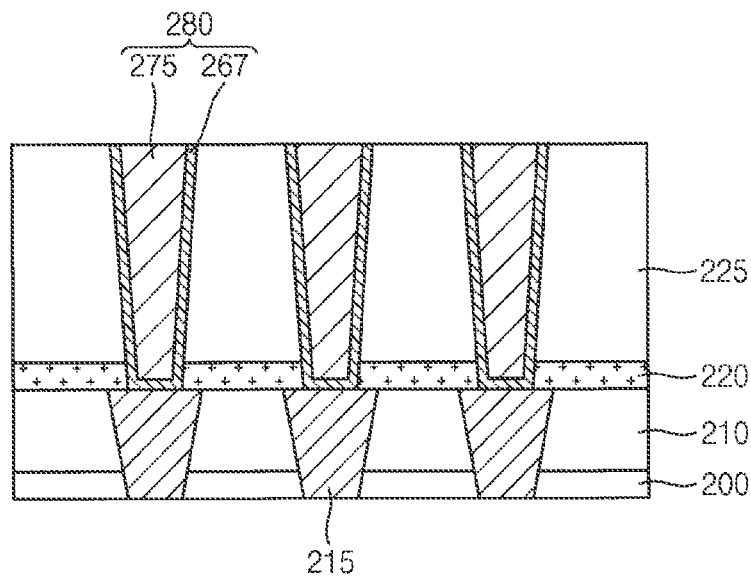

Referring to FIG. 13, upper portions of the conductive layer 270 and the barrier layer 265 may be planarized to form a conductive pattern 280.

In example embodiments, the upper portions of the conductive layer 270 and the barrier layer 265 may be planarized by a CMP process until a top surface of the insulating interlayer 225 is exposed. The photoresist pattern 257, the second etch-stop layer 235 and the buffer layer 230 may be also removed by the planarization process.

Accordingly, a conductive pattern 280 electrically connected to the lower contact 215 may be formed in the opening 260. The conductive pattern 280 may include a barrier layer pattern 267 formed on the sidewall and the bottom of the opening 260, and a conductive layer pattern 275 filling a remaining portion of the opening 260 on the barrier layer pattern 267.

FIGS. 12 and 13 illustrate that the photoresist pattern 257 is removed by the planarization process for the formation of the conductive pattern 280. However, the photoresist pattern 257 may be removed after forming the opening 260 and before forming the barrier layer 265. For example, after forming the opening 260, the photoresist pattern 257 may be removed by an ashing process and/or a strip process.

In example embodiments, a cleaning process may be further performed to remove an etching residue including, e.g., a metallic material which may remain on the insulating interlayer 225.

Figure 14:
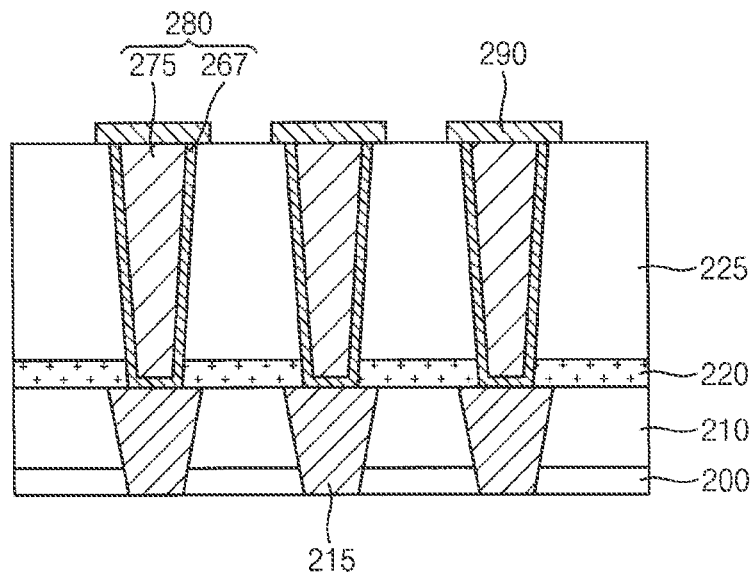

Referring to FIG. 14, a capping layer pattern 290 may be formed on an upper surface of the conductive pattern 280.

For example, a capping layer covering the conductive patterns 280 may be formed on the insulating interlayer 225, and the capping layer may be partially etched to form the capping layer pattern 290 which may cover the conductive pattern 280.

The capping layer may be formed of a metal that may be more chemically stable than a metal included in the conductive pattern 280 by a sputtering process or an ALD process. For example, the capping layer may be formed using a metal, e.g., aluminum, cobalt or molybdenum. In example embodiments, the capping layer may be formed of a nitride of the metal.

The capping layer may be patterned by a wet etching process using an etchant solution that may include peroxide, e.g., hydrogen peroxide.

In example embodiments, a build-up process may be further performed such that additional insulating interlayer, conductive pattern and/or upper wiring may be formed on the insulating interlayer 225 and the capping layer pattern 290. In example embodiments, the conductive pattern 280 may serve as an interconnection structure electrically connecting the lower contact 215 and the upper wiring to each other. In example embodiments, the conductive pattern 280 may serve as a wiring extending linearly, and may be electrically connected to the plurality of the lower contacts 215.

As described above, the opening 260 for the formation of the conductive pattern 280 may be formed using the photoresist polymer according to example embodiments.

As a width of the conductive pattern 280 and a distance between the conductive patterns 280 become decreased, a photolithography process having a high resolution may be needed. According to example embodiments, the exposed portion 253 may be formed substantially solely by the elimination reaction, decarboxylation and/or deesterification that may be photochemically induced, and a developing process may be omitted. Thus, an irregular acid diffusion occurring in a CAR system-based photolithography process may be avoided. Therefore, the conductive pattern having a fine pitch and a fine dimension may be formed as a desired uniform profile, and a resolution of the photolithography process may be improved.

Methods of Manufacturing Semiconductor Devices

FIGS. 15 to 30 are top plan views and cross-sectional views illustrating a method of manufacturing a semiconductor device in accordance with example embodiments.

Figure 15:
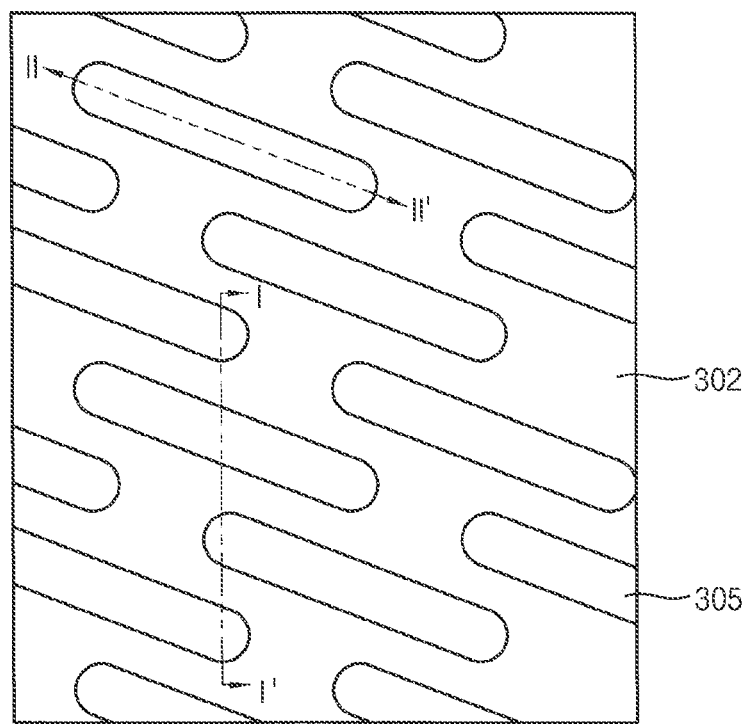
Figure 15:
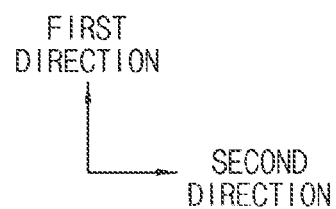
Figure 21:
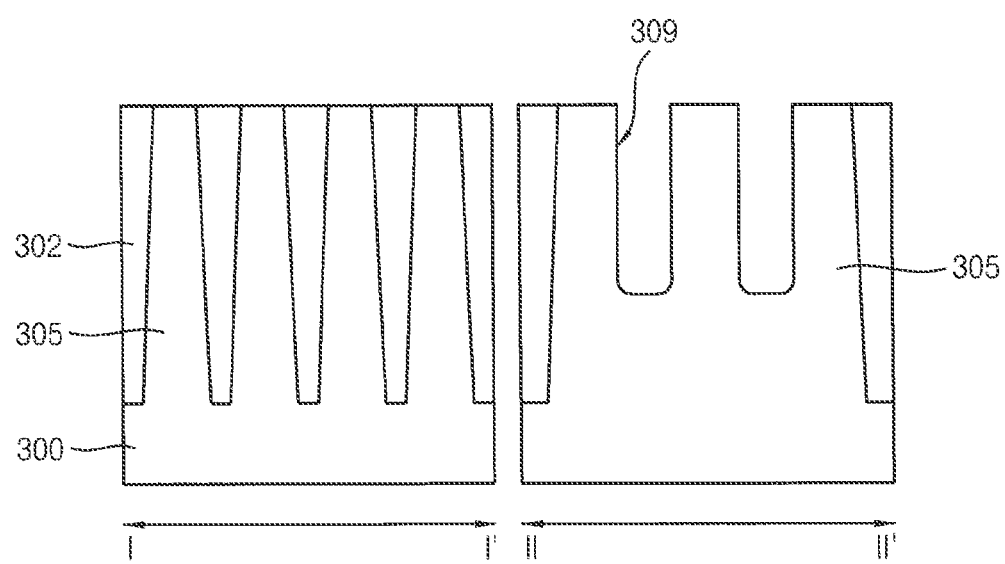
Figure 22:
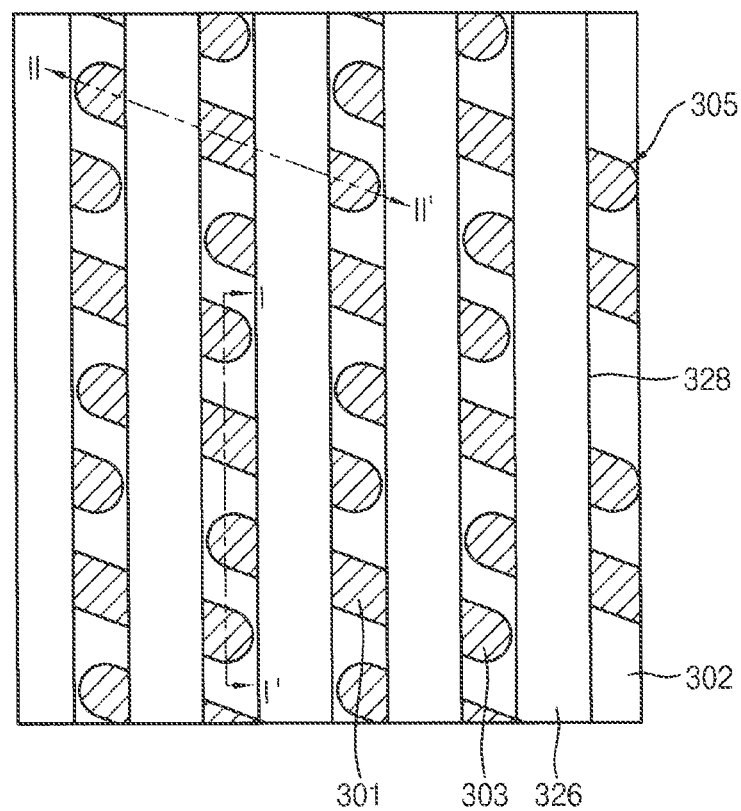
Figure 22:
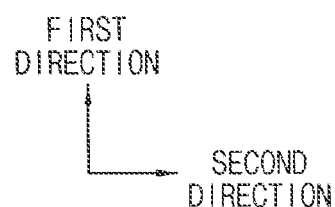
Figure 25:
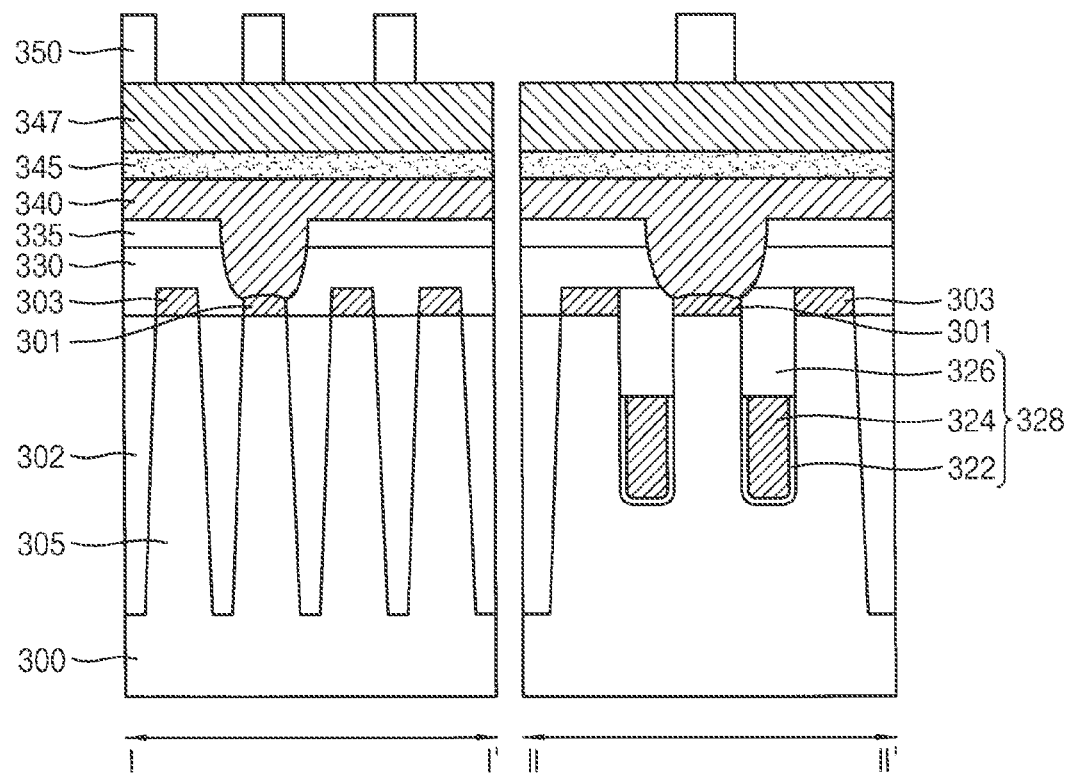
Figure 26:
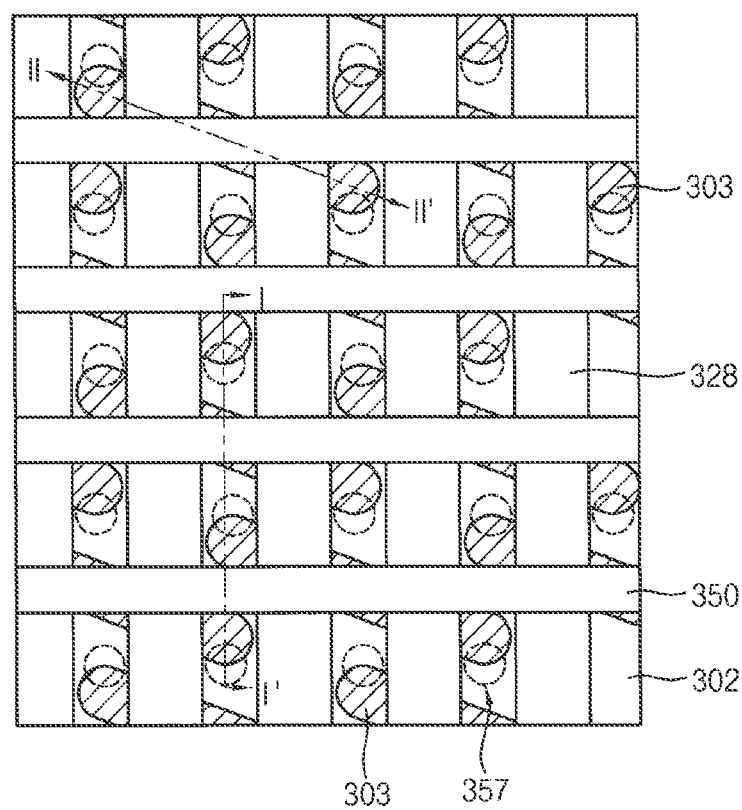
Figure 26:

Specifically, FIGS. 15, 22 and 26 are top plan views illustrating the method of manufacturing the semiconductor device. FIGS. 16 to 21, FIGS. 23 to 25, and FIGS. 27 to 30 are cross-sectional views illustrating the method of manufacturing the semiconductor device. Each of FIGS. 16 to 21, FIGS. 23 to 25, and FIGS. 27 to 30 includes sub-cross sectional views taken along lines I-I' and II-II' indicated in FIGS. 15, 22 and 26.

For example, FIGS. 15 to 30 illustrate a method of manufacturing a semiconductor device including a buried cell array transistor (BCAT) structure. Processes and/or materials substantially the same as or similar to those illustrated with reference to FIGS. 1 to 6, or FIGS. 7 to 14 are omitted herein.

Two directions perpendicular to each other are referred to as a first direction and a second direction. The first and second directions are parallel to a top surface of a substrate. Additionally, a direction indicated by an arrow and a reverse direction thereof are considered as the same direction.

Figure 16:
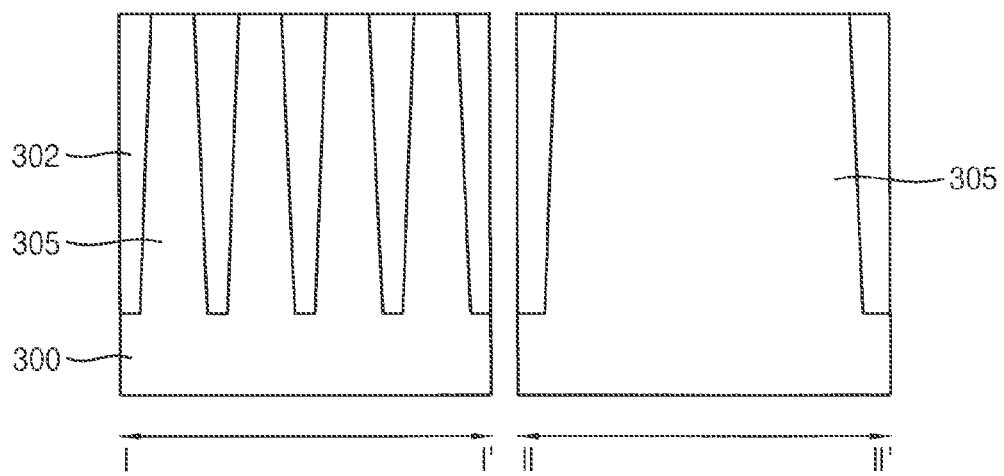

Referring to FIGS. 15 and 16, active patterns 305 and an isolation layer 302 may be formed at an upper portion of a substrate 300.

The substrate 300 may include silicon, germanium, silicon-germanium or a group III-V compound, e.g., GaP, GaAs, or GaSb. In example embodiments, the substrate 300 may be an SOI substrate or a GOI substrate.

In example embodiments, the isolation layer 302 and the active pattern 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide may be formed on the substrate 300. An upper portion of the insulation layer may be planarized by, e.g., a CMP process until a top surface of the substrate 300 is exposed to form the isolation layer 302.

A plurality of the active patterns 305 spaced apart from each other may be formed by the isolation layer 302. As illustrated in FIG. 15, each active pattern 305 may extend in a diagonal direction to the first direction or the second direction by a predetermined or given angle. The plurality of the active patterns 305 may be arranged in the first and second directions.

Figure 17:
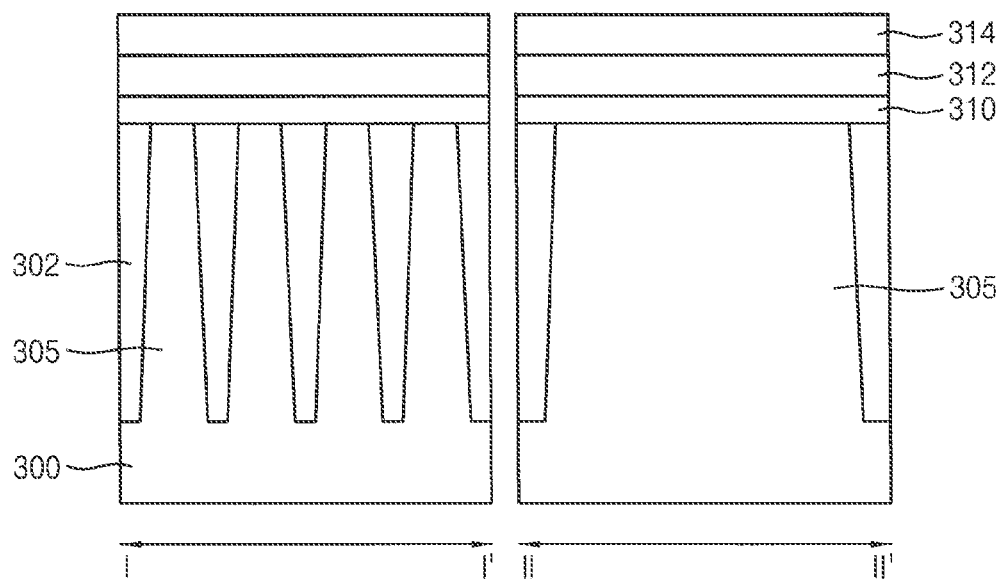

Referring to FIG. 17, an etch-stop layer 310, a mask layer 312 and a photoresist layer 314 may be formed on the isolation layer 302 and the active patterns 305.

The etch-stop layer 310 may be formed of silicon oxynitride or silicon nitride. The etch-stop layer 310 may also serve as an anti-reflective layer. The mask layer 312 may be formed of silicon nitride or silicon oxynitride. In example embodiments, one of the etch-stop layer 310 and the mask layer 312 may be omitted.

The etch-stop layer 310 and the mask layer 312 may be formed by a CVD process, an ALD process, a sputtering process, a spin coating process, etc.

The photoresist layer 314 may be formed using the photoresist polymer according to example embodiments as described above.

As described above, the photoresist polymer may include a polymer synthesized from repeating units to which a leaving group containing an ester group (e.g., a first leaving group) is combined. The repeating unit of the photoresist polymer may further include a leaving group for elimination reaction (e.g., a second leaving group) that may be removed together with the leaving group containing the ester group.

The first leaving group may be represented by the above Chemical Formula 1 or Chemical Formula 2. The second leaving group may include, e.g., a halogen atom.

In example embodiments, the repeating unit may have a structure substantially the same as or similar to that represented by the above Chemical Formulae 3, 4, 5, 6 or 6-1. In example embodiments, the repeating unit of the photoresist polymer may include a leaving group containing an ester group that may have sulfur as represented by the above Chemical Formula 7.

For example, a photoresist composition including the photoresist polymer may be coated on the mask layer 312, and then a thermal curing process, e.g., a baking process may be performed to form the photoresist layer 314. The photoresist composition may further include a sensitizer.

Figure 18:
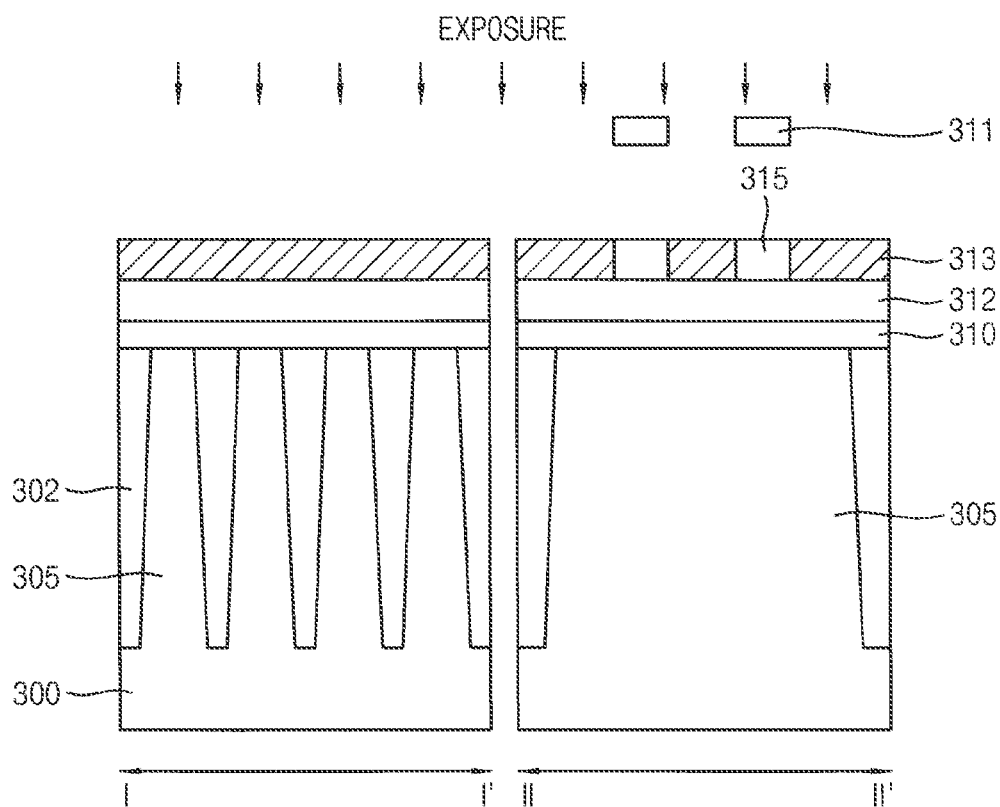

Referring to FIG. 18, a process substantially the same as or similar to that illustrated with reference to FIG. 3 may be performed.

For example, an exposure mask 311 may be placed on the photoresist layer 314, and then an exposure process may be performed on the photoresist layer 314 using an EUV light source. Thus, the photoresist layer 314 may be divided into an exposed portion 313 and a non-exposed portion 315.

An elimination reaction, decarboxylation and/or deesterification may be initiated in the exposed portion 313 by the exposure process so that an etch-resistance of the exposed portion 313 may be remarkably increased relatively to the non-exposed portion 315.

Figure 19:
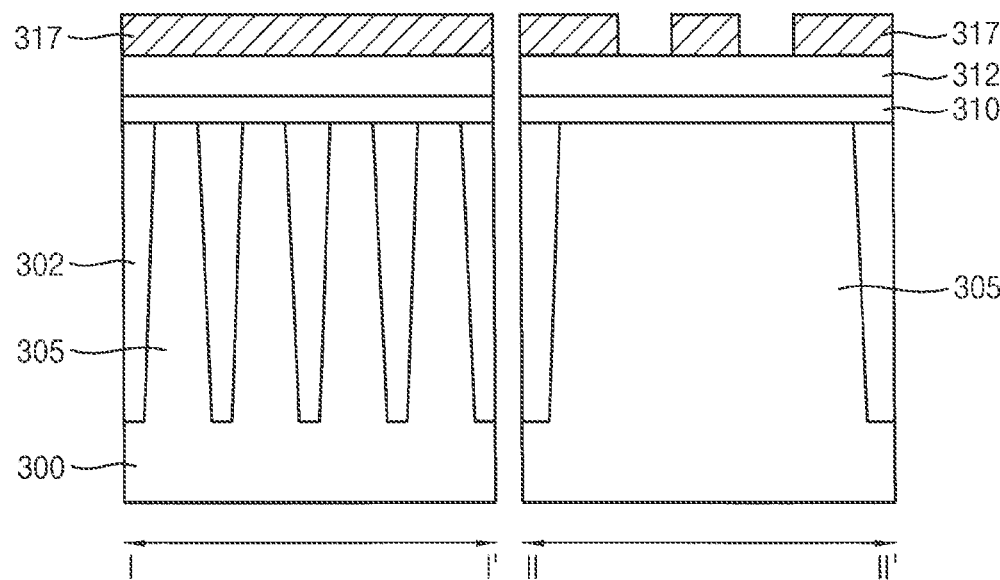

Referring to FIG. 19, a process substantially the same as or similar to that illustrated with reference to FIG. 4 may be performed so that the non-exposed portion 315 of the photoresist layer 314 may be removed. Accordingly, the exposed portion 313 may remain on the mask layer 312 so that a photoresist pattern 317 may be defined.

As described above, the non-exposed portion 315 having a relatively low etch-resistance may be selectively removed by a dry etching process.

Figure 20:
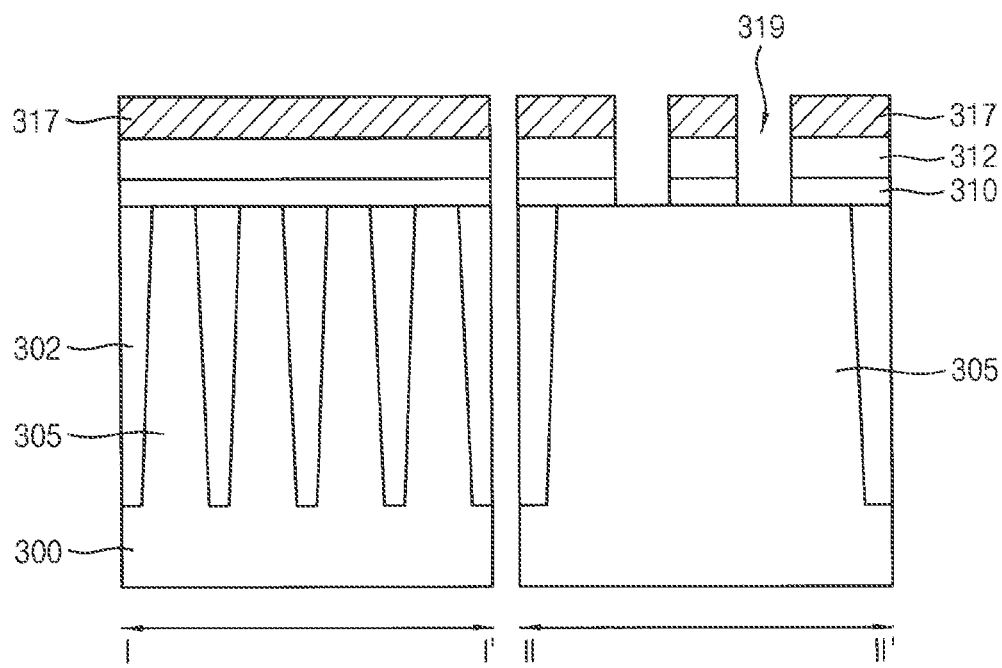

Referring to FIG. 20, the mask layer 312 and the etch-stop layer 310 may be sequentially etched using the photoresist pattern 317 as an etching mask. Accordingly, an opening 319 exposing a top surface of the active pattern 305 may be formed.

In example embodiments, the opening 319 may extend in the first direction, and top surfaces of the active patterns 305 and the isolation layer 302 may be exposed through the opening 319. A plurality of the openings 319 may be arranged along the second direction. In example embodiments, as illustrated in FIG. 20, two openings 319 may extend on one of the active patterns 305.

Referring to FIG. 21, upper portions of the active patterns 305 and the isolation layer 302 exposed through the opening 319 may be etched to form gate trenches 309.

The gate trenches 309 may have an arrangement substantially comparable to that of the openings 319. For example, the gate trench 309 may extend in the first direction, and a plurality of the gate trenches 309 may be formed along the second direction. In example embodiments, two of the gate trenches 309 may be formed at one of the active patterns 305.

In example embodiments, the opening 319 and the gate trench 309 may be formed by substantially the same etching process, e.g., an in-situ etching process. In example embodiments, after the formation of the gate trench 309, the photoresist pattern 317, the mask layer 312 and the etch-stop layer 310 may be removed by a CMP process.

In example embodiments, the opening 319 and the gate trench 309 may be formed by individual etching processes, e.g., ex-situ etching processes. For example, after the formation of the opening 319, the photoresist pattern 317 may be removed by an ashing process and/or a strip process. An additional etching process may be performed to form the gate trench 309, and the mask layer 312 and the etch-stop layer 310 may be removed by a CMP process.

Figure 23:
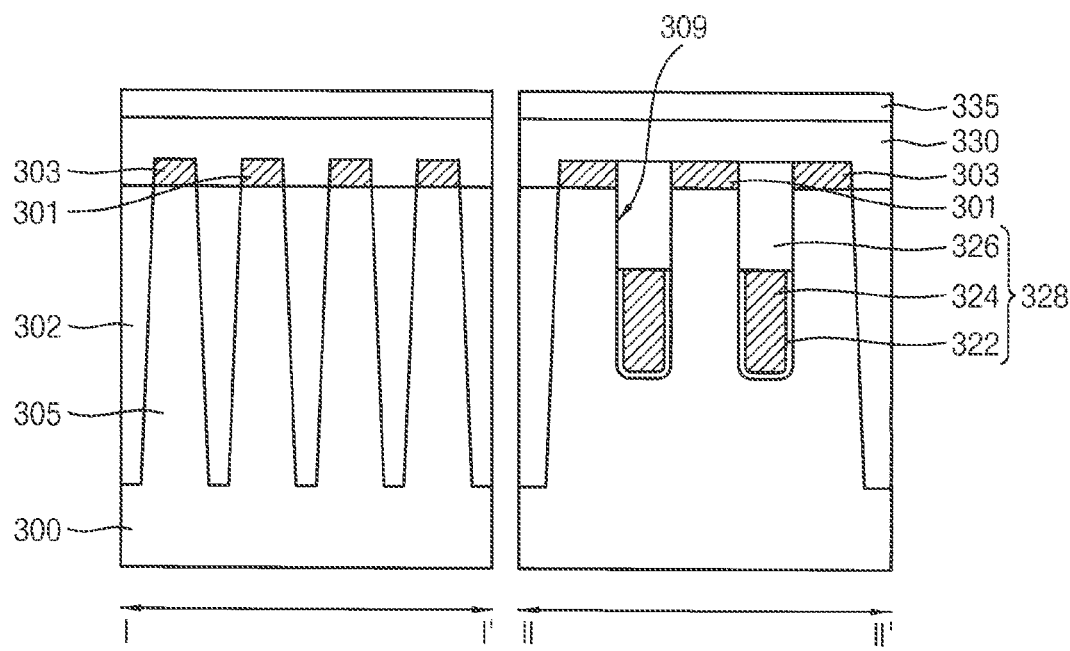

Referring to FIGS. 22 and 23, a gate structure 328 extending in the gate trench 309 may be formed.

In example embodiments, a gate insulation layer may be formed by a thermal oxidation process on a surface of the active pattern 305 exposed by the gate trench 309, or by depositing silicon oxide or a metal oxide through, e.g., a CVD process.

A gate conductive layer filling a remaining portion of the gate trench 309 may be formed on the gate insulation layer. The gate conductive layer may be planarized by a CMP process until the top surface of the active pattern 305 is exposed, and upper portions of the gate insulation layer and the gate conductive layer may be removed by an etch-back process. Accordingly, a gate insulation layer pattern 322 and a gate electrode 324 filling the lower portion of the gate trench 309 may be formed.

The gate conductive layer may be formed using a metal and/or a metal nitride by an ALD process or a sputtering process.

A mask layer filling a remaining portion of the gate trench 309 may be formed on the gate insulation layer 322 and the gate electrode 324, and an upper portion of the mask layer may be planarized until the top surface of the active pattern 305 is exposed to form a gate mask 326. The mask layer may be formed of silicon nitride by, e.g., a CVD process.

Accordingly, the gate structure 328 including the gate insulation layer pattern 322, the gate electrode 324 and the gate mask 326 that may be sequentially stacked in the gate trench 309 may be formed.

According to the arrangement of the gate trenches 309, a plurality of the gate structures 328 may be formed to be arranged along the second direction and each gate structure 328 may extend in the first direction. The gate structure 328 may be buried or embedded in the active pattern 305. An upper portion of the active pattern 305 may be divided into a central portion between two gate structures 328, and a peripheral portion (or end portions) facing the central portion with respect to each of the gate structure 328.

An ion-implantation process may be performed to form a first impurity region 301 and a second impurity region 303 at upper portions of the active pattern 305 adjacent to the gate structures 328. For example, the first impurity region 301 may be formed at the central portion of the active pattern 305, and the second impurity region 303 may be formed at the peripheral portions of the active pattern 305.

In example embodiments, as illustrated in FIG. 23, an upper portion of the isolation layer 302 may be recessed by an etch-back process such that the upper portion of the active pattern 305 may be exposed. Subsequently, the ion-implantation process may be performed to form the first and second impurity regions 301 and 303.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer during subsequent etching processes.

Figure 24:
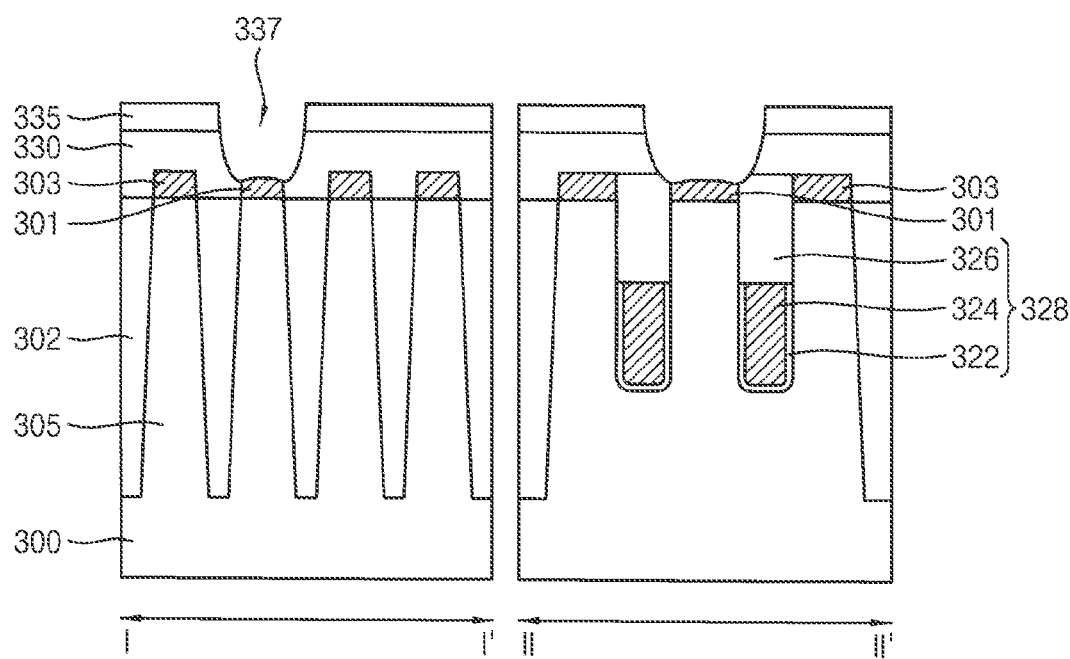

Referring to FIG. 24, the first insulating interlayer 335 and the capping layer 330 may be sequentially and partially etched to form a groove 337 through which the first impurity regions 301 may be exposed. The groove 337 may extend in the second direction indicated in FIG. 15, and a plurality of the grooves 337 may be arranged along the first direction.

In example embodiments, an upper portion of the first impurity region 301 may be partially removed during the etching process for the formation of the groove 337. Accordingly, a height difference between the first and second impurity regions 301 and 303 may be caused, and thus a bridge or a short circuit between a conductive line structure 355 and a conductive contact 375 (see FIG. 30) formed by subsequent processes may be prevented or inhibited.

Referring to FIG. 25, a first conductive layer 340 filling the groove 337 may be formed on the first insulating interlayer 335. A barrier conductive layer 345 and a second conductive layer 347 may be sequentially formed on the first conductive layer 340, and a mask pattern 350 may be formed on the second conductive layer 347.

For example, the first conductive layer 340 may be formed using doped polysilicon, the barrier conductive layer 345 may be formed of a metal nitride or a metal silicide nitride, and the second conductive layer 347 may be formed using a metal. The first conductive layer 340, the barrier conductive layer 345 and the second conductive layer 347 may be formed by, e.g., a sputtering process, a PVD process, CVD process, or an ALD process.

The mask pattern 350 may include, e.g., silicon nitride, and may extend in the second direction. A width of the mask pattern 350 (e.g., a width in the first direction) may be smaller than that of the groove 337.

In example embodiments, the mask pattern 350 may be formed by the method of forming patterns in which the photoresist polymer according to example embodiments may be used.

For example, a mask layer including silicon nitride may be formed on the second conductive layer 347. As described with reference to FIG. 2, a photoresist layer may be formed on the mask layer using the photoresist polymer which may include a leaving group containing an ester group, and may further include a leaving group for elimination reaction. A portion of the photoresist layer overlapping a region of the mask layer for the formation of the mask pattern 350 may be converted into an exposed portion having an improved etch-resistance by an exposure process as illustrated in FIG. 3. A non-exposed portion of the photoresist layer may be removed by a dry etching process to form a photoresist pattern. The mask layer may be partially removed using the photoresist pattern as an etching mask to form the mask pattern 350.

Figure 27:
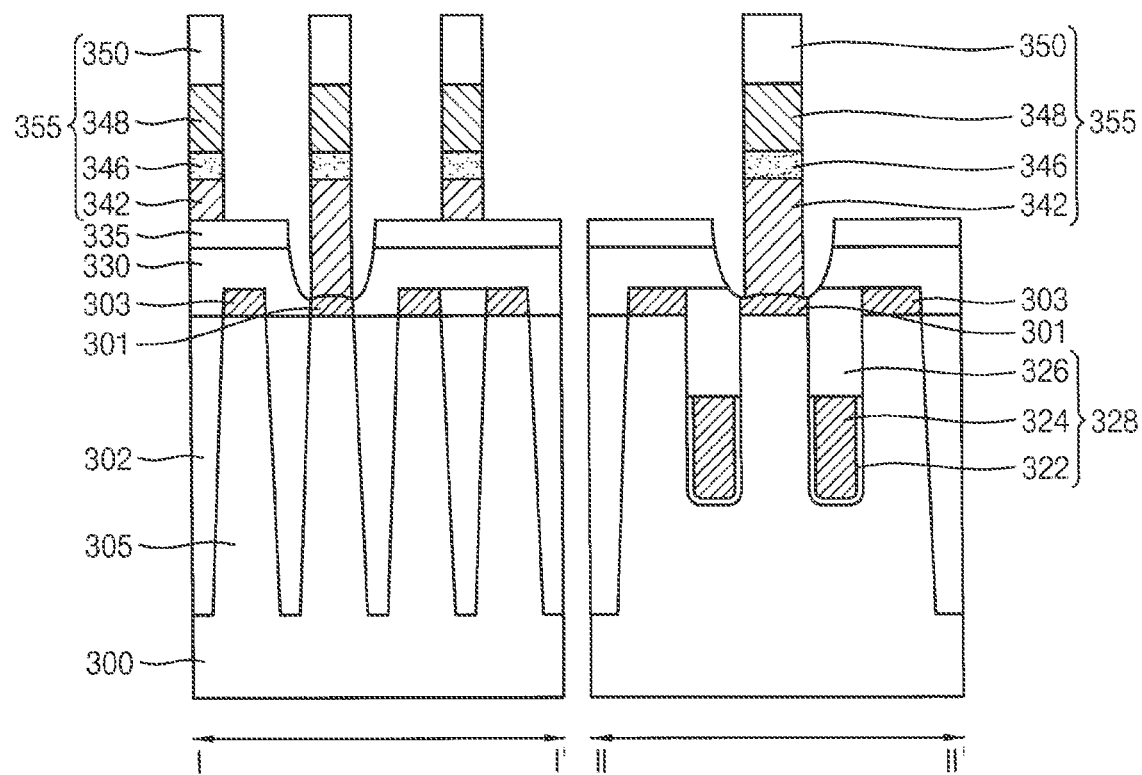

Referring to FIGS. 26 and 27, the second conductive layer 347, the barrier conductive layer 345 and the first conductive layer 340 may be sequentially etched using the mask pattern 350 as an etching mask. Accordingly, a first conductive layer pattern 342, a barrier conductive layer pattern 346 and a second conductive layer pattern 348 may be sequentially formed on the first impurity region 301. For convenience of descriptions, illustrations of the first insulating interlayer 335 and the capping layer 330 are omitted in FIG. 26.

Accordingly, the conductive line structure 355 including the first conductive layer pattern 342, the barrier conductive layer pattern 346, the second conductive layer pattern 348 and the mask pattern 350 may be formed. The conductive line structure 355 may extend in the second direction on the first impurity region 301. In example embodiments, the conductive line structure 355 may serve as a bit line.

In example embodiments, the conductive line structure 355 may have a narrower width that that of the groove 337. Thus, a sidewall of the conductive line structure 355 may be spaced apart from a sidewall of the groove 337.

Figure 28:
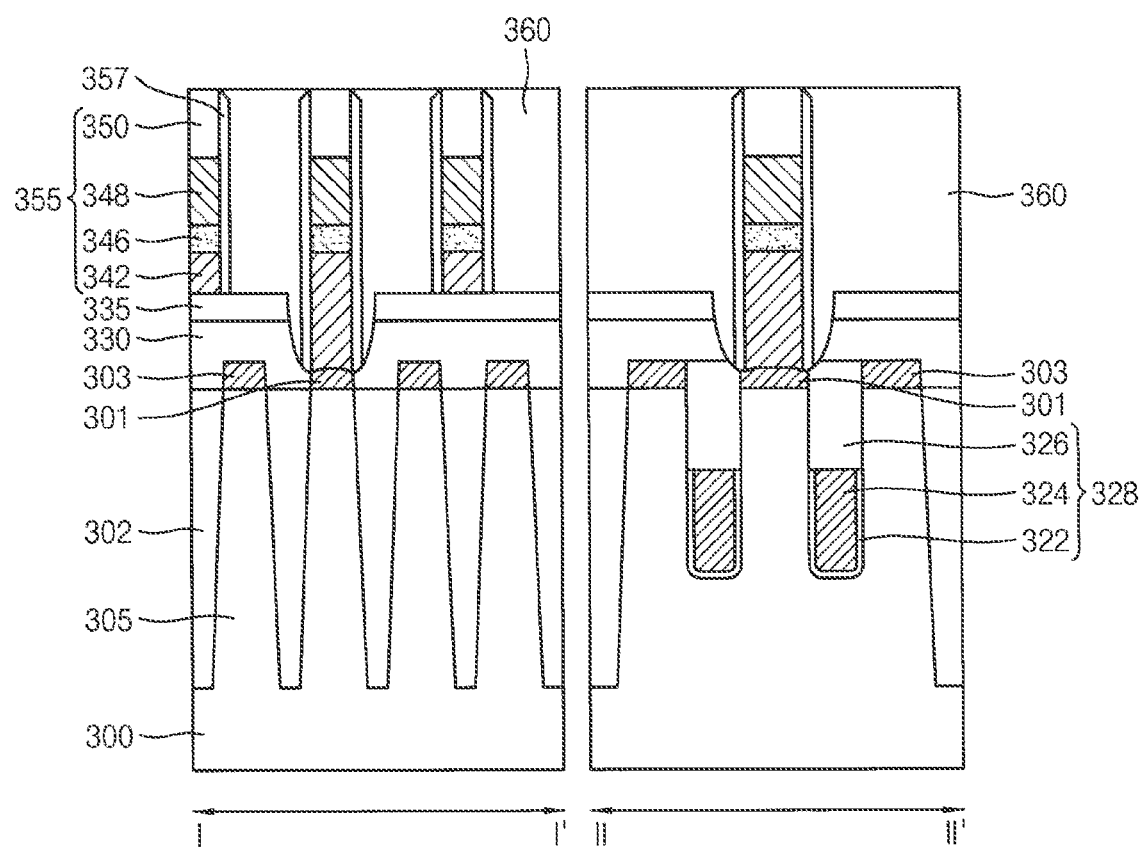

Referring to FIG. 28, a spacer 347 may be formed on the sidewall of the conductive line structure 355. For example, a spacer layer covering the conductive line structure 355 may be formed on the first insulating interlayer 335. The spacer layer may be anisotropically etched to form the spacer 357. The spacer layer may be formed of, e.g., silicon nitride.

A second insulating interlayer 360 covering the conductive line structure 355 may be formed on the first insulating interlayer 335. The second insulating interlayer 360 may fill a remaining portion of the groove 337.

In example embodiments, an upper portion of the second insulating interlayer 360 may be planarized by a CMP process such that a top surface of the mask pattern 350 may be exposed. The second insulating interlayer 360 may be formed of silicon oxide substantially the same as or similar to that of the first insulating interlayer 335.

Figure 29:
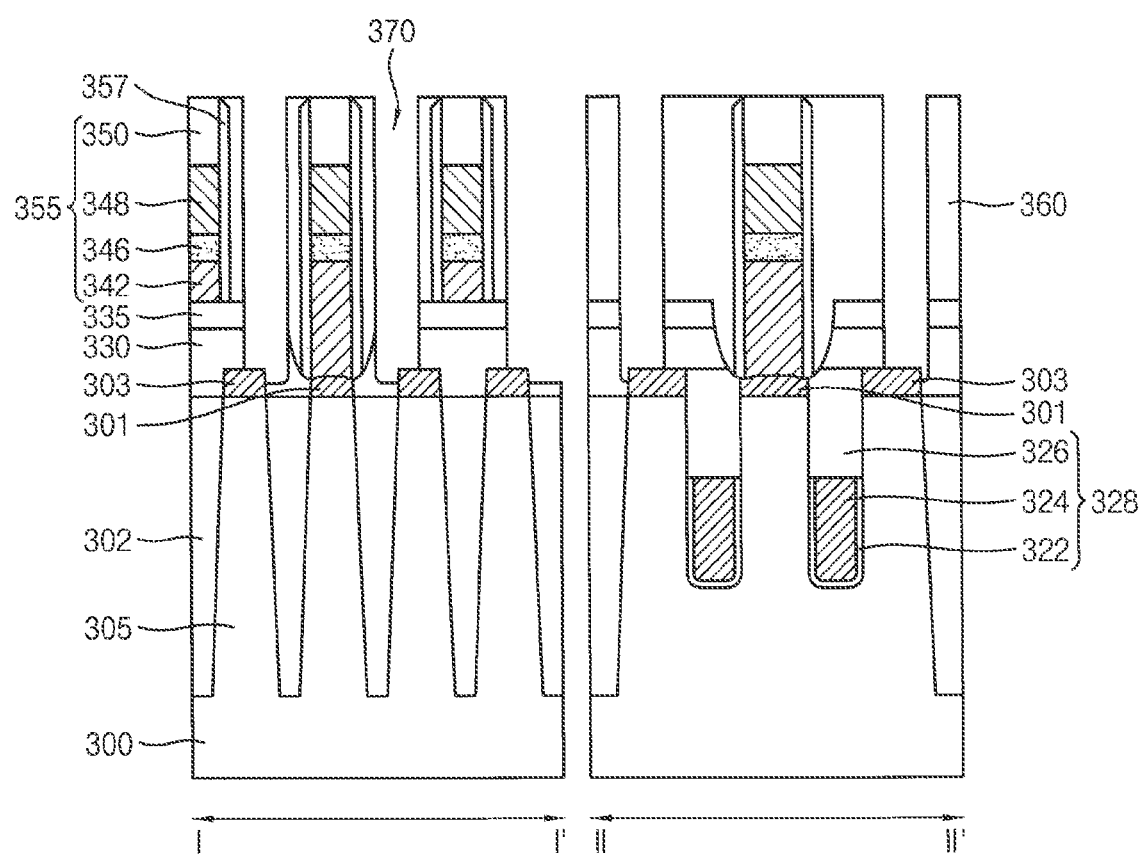

Referring to FIG. 29, a contact hole 370 extending through the second insulating interlayer 360, the first insulating interlayer 335 and the capping layer 330 may be formed. The second impurity region 303 may be at least partially exposed through the contact hole 370. The contact hole 370 may be formed per each of hole formation areas 357 indicated in FIG. 26.

In example embodiments, the contact hole 370 may be formed by the method of forming patterns in which the photoresist polymer according to example embodiments may be used.

For example, a buffer layer and a photoresist layer may be sequentially formed on the second insulating interlayer 360 and the mask pattern 350 by a process substantially the same as or similar to that illustrated with reference to FIG. 2. The photoresist layer may be formed using a photoresist polymer which may include a leaving group containing an ester group, and may further include a leaving group for elimination reaction.

A portion of the photoresist layer corresponding to a region except for the hole formation areas 357 (see FIG. 26) may be converted into an exposed portion having an improved etch-resistance by an exposure process as illustrated in FIG. 3. A non-exposed portion of the photoresist layer may be removed by a dry etching process to form a photoresist pattern.

The buffer layer, the second insulating interlayer 360, the first insulating interlayer 335 and the capping layer 330 may be sequentially and partially removed using the photoresist pattern as an etching mask to form the contact hole 370 exposing the second impurity region.

The photoresist pattern and the buffer layer may be removed by a CMP process, an ashing process and/or a strip process after the formation of the contact hole 370

Figure 30:
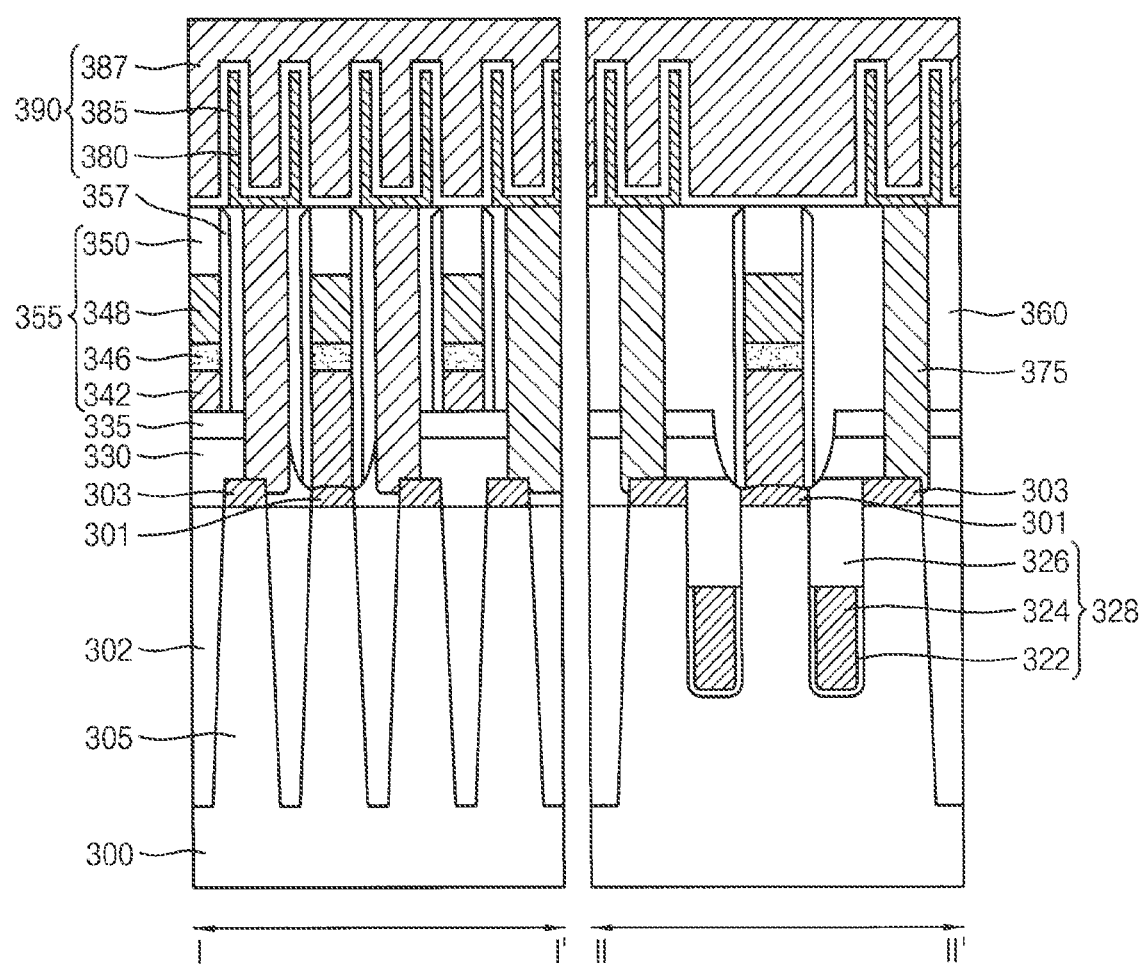

Referring to FIG. 30, the conductive contact 375 filling the contact hole 370 and electrically connected to the second impurity region 303 may be formed. For example, a capacitor 390 may be formed on the conductive contact 375. In example embodiments, the conductive contact 375 may serve as a capacitor contact.

For example, a conductive layer filling the contact holes 370 may be formed, and an upper portion of the conductive layer may be planarized by a CMP process until the top surface of the mask pattern 350 is exposed. Accordingly, the conductive contact 375 may be formed in each contact hole 370, and may be in contact with the second impurity region 303.

The conductive layer may be formed using a metal (e.g., copper or tungsten) by a sputtering process, a PVD process, an ALD process, or a CVD process. In example embodiments, the conductive layer may be formed by an electroplating process or an electroless plating process. In example embodiments, a barrier conductive layer including, e.g., titanium or titanium nitride may be formed on an inner wall of the contact hole 370 before forming the conductive layer.

The capacitor 390 electrically connected to the conductive contact 375 may be formed. Thus, a dynamic random access memory (DRAM) device having the BCAT structure may be achieved.

For example, an etch-stop layer and a mold layer (not illustrated) may be formed on the mask pattern 350, the second insulating interlayer 360 and the conductive contact 375. The mold layer and the etch-stop layer may be partially removed to form a capacitor opening through which a top surface of the conductive contact 375 is exposed.

A lower electrode layer may be formed along an inner wall of the capacitor opening and a top surface of the mold layer. The lower electrode layer may be formed of a metal or a metal nitride. For example, the lower electrode layer may be formed of at least one of tungsten, tungsten nitride, titanium, titanium nitride, tantalum, tantalum nitride and/or ruthenium. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form a lower electrode 380.

A dielectric layer 385 may be formed on surfaces of the etch-stop layer and the lower electrode 380, and an upper electrode 387 may be formed on the dielectric layer 385 to form the capacitor 390. The dielectric layer 385 may be formed of silicon oxide or a metal oxide having a relatively high dielectric constant. The upper electrode 387 may be formed of a metal or a metal nitride substantially the same as or similar to that of the lower electrode 380.

In example embodiments, a magnetic tunnel junction (MTJ) structure may be formed on the conductive contact 375. In example embodiments, the semiconductor device may serve as a magnetic random access memory (MRAM) device having the BCAT structure.

For example, a fixed layer, a free layer and a tunnel barrier layer interposed therebetween may be formed on the mask pattern 350, the second insulating interlayer 360 and the conductive contact 375. The fixed layer and the free layer may be formed of a magnetic material. The tunnel barrier layer may be formed of, e.g., at least one of magnesium oxide, titanium oxide, aluminum oxide, magnesium zinc oxide and magnesium boron oxide.

The free layer, the tunnel barrier layer and the fixed layer may be partially etched to form the MTJ structure on each conductive contact 375. In example embodiments, the etching process for the free layer, the tunnel barrier layer and the fixed layer may include a photolithography process or a method of forming patterns in which the photoresist polymer according to example embodiments may be utilized.

According to example embodiments as described above, a trench or a contact hole having fine pitch and width of a semiconductor device may be formed from an exposure process solely performed by a photo-chemically induced elimination reaction, decarboxylation and/or deesterification instead of a CAR system-based exposure process generating a large amount of acid. Thus, a reduction of resolution and a mis-alignment of, e.g., the trench or the contact hole caused by an acid diffusion may be avoided. Further, a process cost and a process time may be saved because a developing process may be omitted.

The photoresist polymer in accordance with example embodiments may be used in a photolithography process for a formation of a fine pattern having a dimension of, e.g., less than about 20 nm. Wirings, contacts, insulation patterns, etc., of various semiconductor devices (e.g., DRAM or MRAM devices) may be formed by the photolithography process with high resolution and reliability.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a pattern, comprising:
forming a photoresist layer on an object layer, the photoresist layer including a polymer synthesized from a repeating unit having one or more leaving groups containing an ester group;
performing an exposure process on the photoresist layer to form an exposed portion from which the leaving groups containing the ester group are removed, and a non-exposed portion at which the leaving groups containing the ester group remain; and
etching the non-exposed portion of the photoresist layer to form a photoresist pattern,
wherein the repeating unit further includes a leaving group containing a halogen atom such that the leaving group containing the ester group and the leaving group containing the halogen atom are in a staggered configuration and an anti-periplanar configuration for an elimination reaction,
wherein the removal of the leaving groups facilitates a formation of a double bond or a carbon-hydrogen bond in the repeating unit.

2. The method of claim 1, wherein the repeating unit is represented by one of Chemical Formula 3 and Chemical Formula 4, and the repeating unit is converted to a structure as represented by Chemical Formula 8 in the exposed portion:

[Chemical Formula 3]

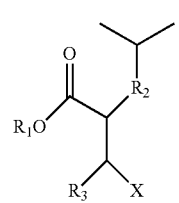

[Chemical Formula 4]

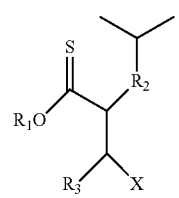

-continued

[Chemical Formula 8]

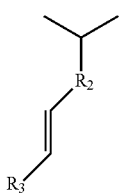

wherein, in Chemical Formulae 3, 4 and 8, $R_1$ and $R_3$ are independently one of hydrogen, a $C_1$-$C_{20}$ alkyl group, a $C_3$-$C_{10}$ cycloalkyl group, a $C_6$-$C_{30}$ aromatic group and a combination thereof, $R_2$ is a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof, and X represents the leaving group for the elimination reaction selected from one of fluorine (F), chlorine (Cl), bromine (Br) and iodine (I).

3. The method of claim 1, wherein the repeating unit is represented by Chemical Formula 5, and the repeating unit is converted to a structure as represented by Chemical Formula 9 in the exposed portion:

[Chemical Formula 5]

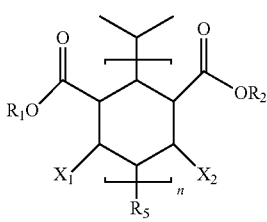

[Chemical Formula 9]

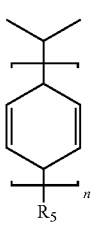

wherein, in Chemical Formulae 5 and 9, each of $R_1$, $R_2$ and $R_5$ are independently one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$ and $R_5$ are the same as or different from each other, each of $X_1$ and $X_2$ represent the leaving group for the elimination reaction independently selected from one of F, Cl, Br and I, and $X_1$ and $X_2$ are the same as or different from each other, and n is an integer greater than 1.

4. The method of claim 3, wherein the repeating unit is represented by Chemical Formula 6, and the repeating unit is converted to a structure as represented by Chemical Formula 10 in the exposed portion:

[Chemical Formula 6]

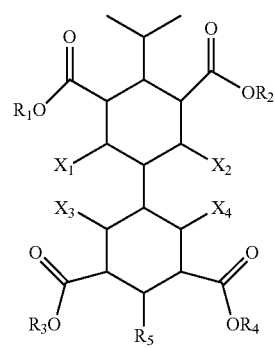

[Chemical Formula 10]

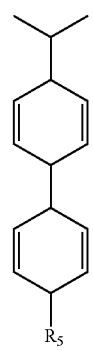

wherein, in Chemical Formulae 6 and 10, each of $R_1$, $R_2$, $R_3$, $R_4$ and $R_5$ are independently one of hydrogen, a $C_1$-$C_{20}$ alkyl group, a $C_3$-$C_{10}$ cycloalkyl group, a $C_6$-$C_{30}$ aromatic group and a combination thereof, and $R_1$, $R_2$, $R_3$, $R_4$ and $R_5$ are the same as or different from each other, and each of $X_1$, $X_2$, $X_3$, and $X_4$ represent the leaving group for the elimination reaction independently selected from one of F, Cl, Br and I, and $X_1$, $X_2$, $X_3$, and $X_4$ are the same as or different from each other.

5. A method of forming a pattern, comprising:

forming a photoresist layer on an object layer, the photoresist layer including a polymer synthesized from a repeating unit having one or more leaving groups containing an ester group;

performing an exposure process on the photoresist layer to form an exposed portion from which the leaving groups containing the ester group are removed, and a non-exposed portion at which the leaving groups containing the ester group remain; and etching the non-exposed portion of the photoresist layer to form a photoresist pattern, wherein the repeating unit is represented by Chemical Formula 7, and the repeating unit is converted to a structure as represented by Chemical Formula 11 in the exposed portion:

[Chemical Formula 7]

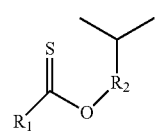

-continued

[Chemical Formula 11]

wherein, in Chemical Formulae 7 and 11, $R_1$ is one of hydrogen, a $C_1$-$C_{20}$ alkyl group, a $C_3$-$C_{10}$ cycloalkyl group, a $C_6$-$C_{30}$ aromatic group and a combination thereof, and $R_2$ is a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof.

6. The method of claim 1, wherein the etching includes selectively removing the non-exposed portion by a dry etching process.

7. The method of claim 1, wherein the performing forms the exposed portion having an etch-resistance greater than that of the non-exposed portion.

8. The method of claim 7, wherein the performing forms the exposed portion having a degree of unsaturation greater than that of the non-exposed portion.

9. The method of claim 7, wherein the performing forms the non-exposed portion having a greater number of one of oxygen and sulfur atoms than that included in the exposed portion.

10. The method of claim 7, wherein the performing forms the exposed portion having one of an anti-aromatic structure and a hyper-conjugation structure.

11. The method of claim 1, wherein the performing performs the exposure process using at least one light source selected from extreme ultraviolet (EUV), I-line, KrF and ArF.

12. The method of claim 11, wherein the forming coats a photoresist composition that includes the polymer, a solvent and a sensitizer.

13. The method of claim 1, further comprising:
patterning the object layer using the photoresist pattern as an etching mask.

14. A method of forming a pattern, comprising:
forming a photoresist layer on an object layer, the photoresist layer including a polymer synthesized from a repeating unit that includes a first leaving group and a second leaving group, the first leaving group including an ester group, the second leaving group including a halogen atom;
performing a selective exposure process on the photoresist layer to induce an elimination reaction such that the first leaving group and the second leaving group are separated from the polymer at an exposed portion of the photoresist layer; and
removing a non-exposed portion of the photoresist layer to form a photoresist pattern,
wherein the first leaving group and the second leaving group are in a staggered configuration and an anti-periplanar configuration for an elimination reaction,
wherein the removal of the leaving groups facilitates a formation of a double bond or a carbon-hydrogen bond in the repeating unit.

15. The method of claim 14, wherein the first leaving group is represented by one of Chemical Formula 1 and Chemical Formula 2:

—$CO_2R_1$ [Chemical Formula 1]

—$CSOR_1$ [Chemical Formula 2]

wherein, in Chemical Formulae 1 and 2, R is one of hydrogen (H), a $C_1$-$C_{20}$ alkyl group, a $C_3$-$C_{10}$ cycloalkyl group, a $C_6$-$C_{30}$ aromatic group and a combination thereof.

16. The method of claim 14, wherein the performing removes the first and second leaving groups at the exposed portion so that a degree of unsaturation and an etch-resistance of the exposed portion are increased.

17. A method of manufacturing a semiconductor device, comprising:
forming a plurality of active patterns defined by an isolation layer on a substrate;
forming a photoresist layer on the active patterns and the isolation layer, the photoresist layer including a polymer synthesized from a repeating unit including a leaving group containing an ester group;
performing an exposure process on the photoresist layer to form an exposed portion from which the leaving group containing the ester group is removed, and a non-exposed portion at which the leaving group containing the ester group remains;
etching the non-exposed portion of the photoresist layer to form a photoresist pattern;
partially etching the isolation layer and the active patterns using the photoresist pattern as an etching mask to form a plurality of trenches; and
forming a gate structure in each of the plurality of trenches,
wherein the repeating unit further includes a leaving group containing a halogen atom such that the leaving group containing the ester group and the leaving group containing the halogen atom are in a staggered configuration and an anti-periplanar configuration for an elimination reaction,
wherein the removal of the leaving groups facilitates a formation of a double bond or a carbon-hydrogen bond in the repeating unit.

18. The method of claim 17, wherein the forming a gate structure includes:
forming a gate insulation layer and a gate electrode layer filling the trenches sequentially on the plurality of active patterns and the isolation layer; and
partially removing upper portions of the gate insulation layer and the gate electrode layer.

19. The method of claim 17, wherein the repeating unit is represented by one of Chemical Formula 3 and Chemical Formula 4, and the repeating unit is converted to a structure as represented by Chemical Formula 8 in the exposed portion:

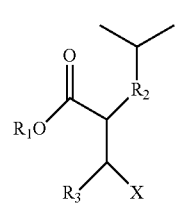

[Chemical Formula 3]

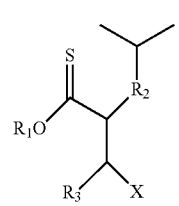

[Chemical Formula 4]

[Chemical Formula 8]

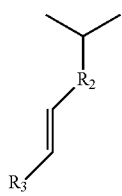

wherein, in Chemical Formulae 3, 4 and 8, $R_1$ and $R_3$ are independently one of hydrogen, a $C_1$-$C_{20}$ alkyl group, a $C_3$-$C_{10}$ cycloalkyl group, a $C_6$-$C_{30}$ aromatic group and a combination thereof, $R_2$ is a divalent group selected from one of styrene, hydroxystyrene, acrylate, $C_1$-$C_6$ alkylene, arylene, carbonyl, oxy, a $C_2$-$C_{30}$ unsaturated aliphatic group and a combination thereof, and X is one of fluorine (F), chlorine (Cl), bromine (Br) and iodine (I).

* * * * *